United States Patent
Kim et al.

(10) Patent No.: US 10,516,388 B1
(45) Date of Patent: Dec. 24, 2019

(54) VOLTAGE GENERATOR, VOLTAGE WAVEFORM GENERATOR, SEMICONDUCTOR DEVICE MANUFACTURING APPARATUS, VOLTAGE WAVEFORM GENERATION METHOD, AND SEMICONDUCTOR DEVICE MANUFACTURING METHOD

(71) Applicant: SAMSUNG ELECTRONICS CO., LTD., Suwon-si, Gyeonggi-do (KR)

(72) Inventors: Hye-jin Kim, Hwaseong-si (KR); Hyun-bae Kim, Yongin-si (KR); Ju-hyun Kim, Hwaseong-si (KR); Ji-hwan Kim, Hwaseong-si (KR); Chan-hee Park, Suwon-si (KR); Young-hwan Choi, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/263,210

(22) Filed: Jan. 31, 2019

(30) Foreign Application Priority Data

Jul. 31, 2018 (KR) .................. 10-2018-0089503

(51) Int. Cl.
| | | |
|---|---|---|
| *G05F 3/02* | (2006.01) | |
| *H03K 3/64* | (2006.01) | |
| *H01J 37/32* | (2006.01) | |
| *G05F 3/08* | (2006.01) | |
| *H03K 3/021* | (2006.01) | |

(52) U.S. Cl.
CPC .................. *H03K 3/64* (2013.01); *G05F 3/02* (2013.01); *G05F 3/08* (2013.01); *H01J 37/321* (2013.01); *H01J 37/32146* (2013.01); *H01J 37/32174* (2013.01); *H03K 3/021* (2013.01)

(58) Field of Classification Search
CPC .. H03K 3/64; H03K 3/021; G05F 3/08; H01J 37/321; H01J 37/32146; H01J 37/32174
See application file for complete search history.

(56) References Cited

U.S. PATENT DOCUMENTS

| | | | |
|---|---|---|---|
| 7,507,672 B1 | 3/2009 | Abatchev et al. | |
| 7,772,823 B2 * | 8/2010 | Blanken ............ | H02M 3/33507 323/223 |
| 8,049,681 B2 | 11/2011 | Yang et al. | |
| 8,140,292 B2 | 3/2012 | Wendt | |
| 8,159,487 B2 | 4/2012 | Kusama et al. | |
| 8,259,140 B2 | 9/2012 | Murayama | |
| 9,685,297 B2 | 6/2017 | Carter et al. | |
| 9,767,988 B2 | 9/2017 | Brouk et al. | |
| 2015/0015219 A1 * | 1/2015 | Ishino ................. | H02M 3/1584 323/271 |
| 2018/0032100 A1 * | 2/2018 | Kim ..................... | G06F 1/0321 |

FOREIGN PATENT DOCUMENTS

KR    10-2018-0012060 A    2/2018

* cited by examiner

*Primary Examiner* — Dinh T Le
(74) *Attorney, Agent, or Firm* — Lee & Morse, P.C.

(57) ABSTRACT

A voltage generator includes a pulse circuit and a slope circuit. The pulse circuit is to apply voltages of three different levels to an output terminal and the slope circuit is to apply a slope voltage to the output terminal. The slope circuit includes an inductor to take current out of a capacitive load connected to the output terminal.

20 Claims, 34 Drawing Sheets

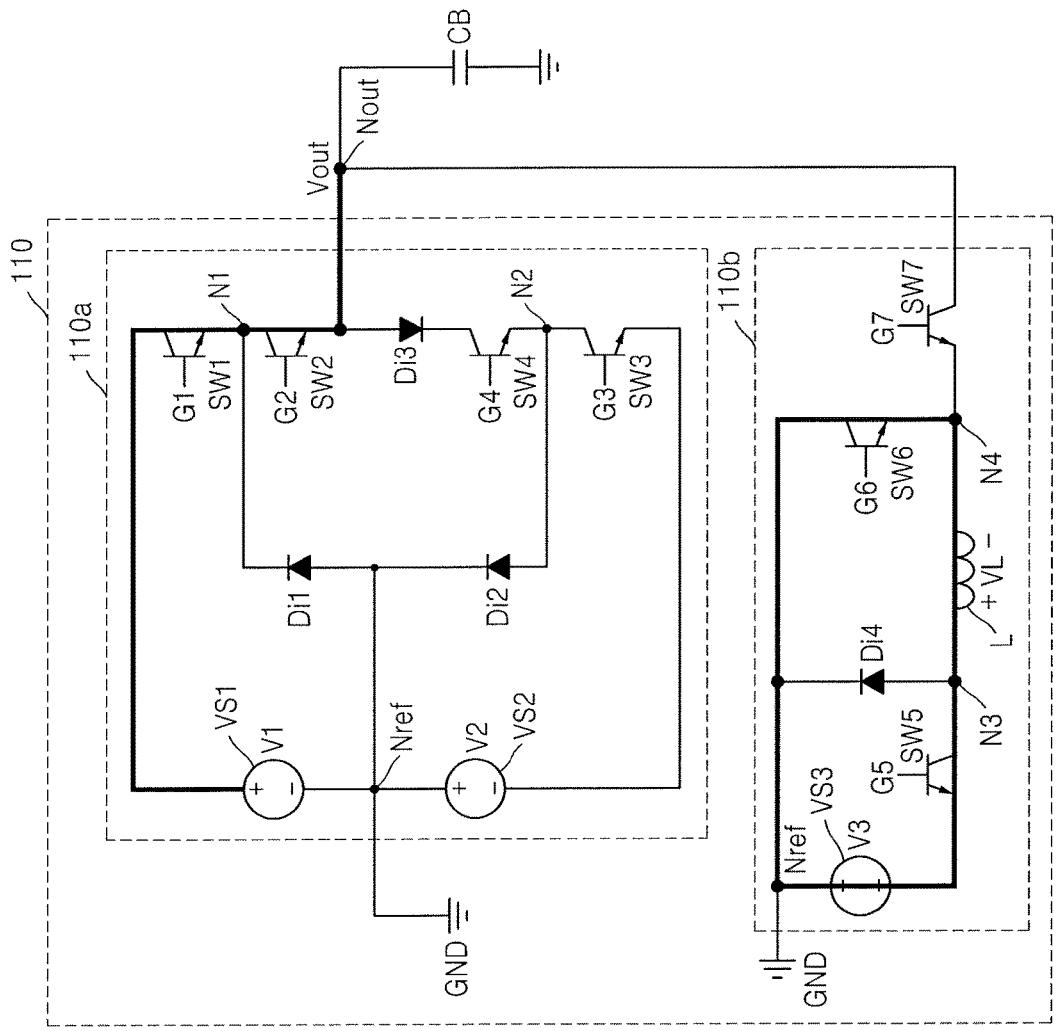
FIG. 4A
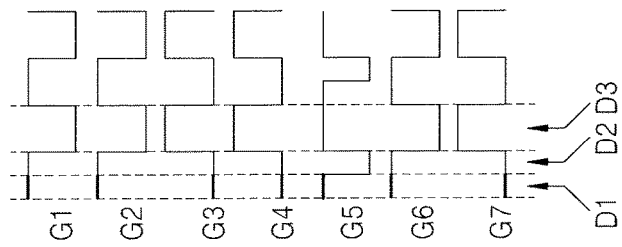

VOLTAGE GENERATOR, VOLTAGE WAVEFORM GENERATOR, SEMICONDUCTOR DEVICE MANUFACTURING APPARATUS, VOLTAGE WAVEFORM GENERATION METHOD, AND SEMICONDUCTOR DEVICE MANUFACTURING METHOD

CROSS-REFERENCE TO RELATED APPLICATION

Korean Patent Application No. 10-2018-0089503, filed on Jul. 31, 2018, in the Korean Intellectual Property Office, and entitled: "Voltage Generator, Voltage Waveform Generator, Semiconductor Device Manufacturing Apparatus, Voltage Waveform Generation Method, and Semiconductor Device Manufacturing Method," is incorporated by reference herein in its entirety.

BACKGROUND

1. Field

Embodiments relate to a voltage generator, a voltage waveform generator, a semiconductor device manufacturing apparatus, a voltage waveform generation method, and a semiconductor device manufacturing method.

2. Description of the Related Art

In general, semiconductor devices are manufactured via various unit processes including a deposition process in which a thin layer is formed and an etching process in which the thin layer is etched. A plasma process, which is an example of a unit process, is performed in a semiconductor device manufacturing apparatus which etches and deposits a material layer. Due to miniaturization and high integration of semiconductor devices to be manufactured, the influence of small errors in a plasma process upon the quality of semiconductor products is increasingly important. Accordingly, there is a demand for a way of improving the performance of semiconductor equipment by precisely controlling a plasma reaction and energy within the semiconductor equipment.

SUMMARY

According to one or more embodiments, a voltage generator may include a pulse circuit to apply voltages of three different levels to an output terminal and a slope circuit to apply a slope voltage to the output terminal. The slope circuit may include an inductor to take current out of a capacitive load connected to the output terminal.

According to one or more embodiments, a voltage waveform generator may include a voltage generator including a pulse circuit to apply a voltage of a first level and a voltage of a second level to an output terminal, and a slope circuit to apply a slope voltage to the output terminal; and a controller to control the voltage generator. The controller may control the voltage generator such that a voltage of the output terminal is maintained at the first level during a first interval, the voltage of the output terminal is maintained at the first level during a second interval following the first interval, and a slope voltage changes from the second level to a third level having a greater magnitude than the second level during a third interval following the second interval. The slope circuit may include an inductor and applies the slope voltage by discharging a capacitive load connected to the output terminal using a current of the inductor.

According to one or more embodiments, a semiconductor device manufacturing apparatus may include a voltage waveform generator and a chamber to receive a voltage output from the voltage waveform generator. The voltage waveform generator may include at least one pulse circuit to output voltages of at least three different levels and at least one slope circuit to output a slope voltage. The at least one slope circuit may include an inductor to generate a current used to generate the slope voltage.

According to one or more embodiments, a voltage waveform generation method may include, during a first interval, connecting a first DC voltage source to a capacitive load, floating a second DC voltage source, and connecting a third DC voltage source to an inductor; during a second interval, disconnecting the third DC voltage source from the inductor and forming a loop that allows current of the inductor to flow; and, during a third interval, floating the first DC voltage source, connecting the second DC voltage source to the capacitive load via a diode, and connecting the capacitive load to the inductor.

According to one or more embodiments, a semiconductor device manufacturing method may include generating plasma within a chamber and performing a semiconductor process with respect to a semiconductor wafer in the chamber using the generated plasma. Generating the plasma may include applying first power for generating the plasma and applying second power for controlling ion energy of the plasma. Generating the second power includes applying a first voltage waveform including a first pulse and a first slope that occur sequentially during a first period; and applying a second voltage waveform including a second pulse and a second slope that occur sequentially during a second period following the first period, a magnitude of the second pulse being greater than a magnitude of the first pulse.

BRIEF DESCRIPTION OF THE DRAWINGS

Features will become apparent to those of skill in the art by describing in detail exemplary embodiments with reference to the attached drawings in which:

FIGS. 4A through 4C illustrate circuit diagrams for explaining an operation of the voltage generator of FIG. 2;

DETAILED DESCRIPTION

Figure 1:
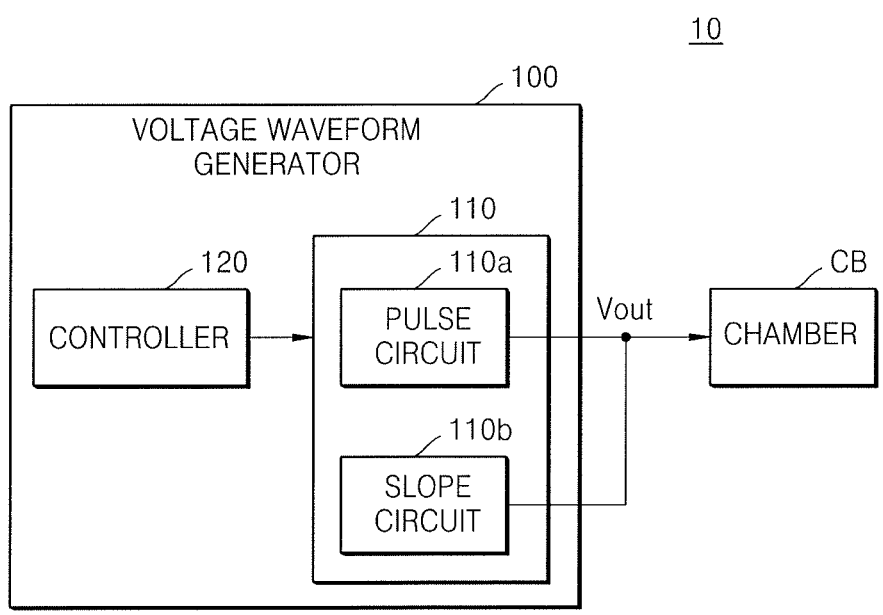
FIG. 1 illustrates a schematic block diagram of a semiconductor device manufacturing apparatus according to some embodiments.

Embodiments will now be described more fully with reference to the accompanying drawings. In the accompanying drawings, like reference numerals may refer to like elements, and repeated descriptions of the like elements will be omitted.

FIG. 1 is a schematic block diagram of a semiconductor device manufacturing apparatus 10 according to some embodiments. Referring to FIG. 1, the semiconductor device manufacturing apparatus 10 may include a voltage waveform generator 100 and a chamber CB. The voltage waveform generator 100 may generate an output voltage Vout having a certain waveform set by a user, and provide the generated output voltage Vout to the chamber CB. For example, the set waveform may have a frequency of several kHz to several MHz, and may be output with an arbitrary variable voltage level of several tens of V to several tens of kV. A semiconductor wafer that is to undergo a process may be disposed within the chamber CB, and the process may be performed on the semiconductor wafer by using an output voltage provided by the chamber CB.

The voltage waveform generator 100 may include a voltage generator 110 and a controller 120. The voltage generator 110 may include a circuit device for generating the output voltage Vout. The controller 120 may be a circuit for controlling the voltage generator 110. The voltage generator 110 may include at least one pulse circuit 110a and at least one slope circuit 110b. According to some embodiments, the pulse circuit 110a may output voltages of three different levels. The slope circuit 110b may generate a variable voltage having a slope waveform. The number of pulse circuits 110a and the number of slope circuits 110b may be variously selected according to embodiments.

Figure 2:
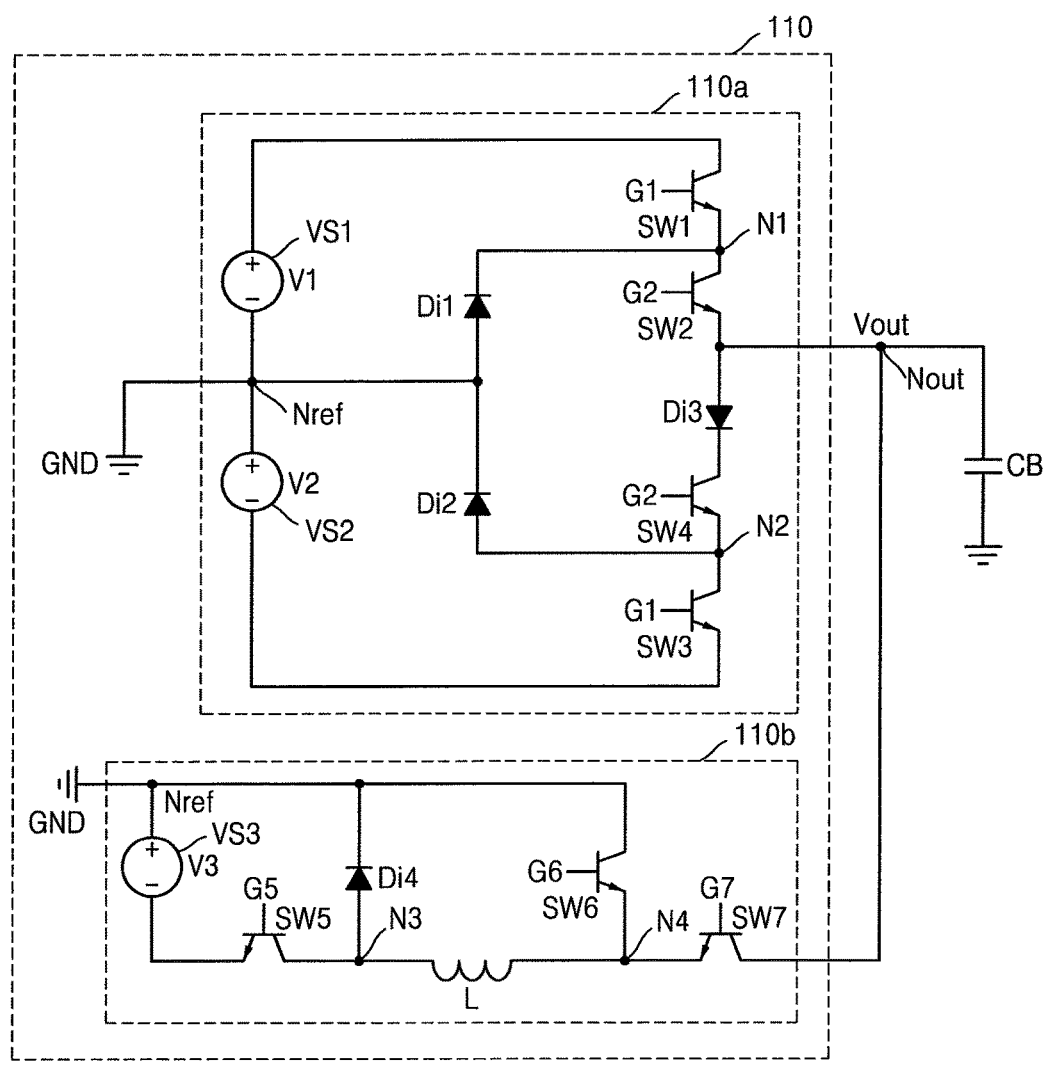
FIG. 2 illustrates a circuit diagram of a voltage generator according to some embodiments.

FIG. 2 is a circuit diagram of the voltage generator 110 according to some embodiments. Referring to FIG. 2, the voltage generator 110 may include the pulse circuit 110a and the slope circuit 110b. According to some embodiments, the pulse circuit 110a and the slope circuit 110b may be connected to each other in parallel. According to some embodiments, the pulse circuit 110a and the slope circuit 110b may be connected to each other in parallel between an output terminal Nout outputting the output voltage Vout and a ground terminal GND providing a reference potential. The chamber CB may be further connected to the output terminal Nout. In this case, the chamber CB may be modelled as a capacitive load, e.g., a capacitor.

The pulse circuit 110a may include first and second voltage sources VS1 and VS2, first through third diodes Di1, Di2, and Di3, and first through fourth switches SW1, SW2, SW3, and SW4. The first and second voltage sources VS1 and VS2 may be connected to a reference terminal Nref. The reference terminal Nref may be connected to the ground terminal GND and may provide the pulse circuit 110a with the reference potential (e.g., a potential of 0). A negative terminal of the first voltage source VS1 may be connected to the reference terminal Nref, and a positive terminal of the second voltage source VS2 may be connected to the reference terminal Nref.

According to some embodiments, the first and second voltage sources VS1 and VS2 may sequentially output first and second voltages V1 and V2, respectively. According to some embodiments, the first and second voltage sources VS1 and VS2 may be direct-current (DC) voltage sources. For example, the first and second voltages V1 and V2 may have variable values. According to some embodiments, the first and second voltages V1 and V2 may have the same magnitude, or the magnitude of the first voltage V1 may be less than or equal to the magnitude of the second voltage V2.

The first switch SW1 may be connected between a positive terminal of the first voltage source VS1 and a first node N1, and may be controlled by a first gate driving signal G1. The second switch SW2 may be connected between the first node N1 and the output terminal Nout and may be controlled by a second gate driving signal G2.

The third switch SW3 may be connected between a negative terminal of the second voltage source VS2 and a second node N2, and may be controlled by a third gate driving signal G3. The fourth switch SW4 may be connected between the second node N2 and the output terminal Nout, and may be controlled by a fourth gate driving signal G4. The negative terminal of the first voltage source VS1 may be connected to the reference terminal Nref.

The first diode Di1 may be connected between the reference terminal Nref and the first node N1. An anode of the first diode Di1 may be connected to the reference terminal Nref and a cathode thereof may be connected to the first node N1. The second diode Di2 may be connected between the reference terminal Nref and the second node N2. A cathode of the second diode Di2 may be connected to the reference terminal Nref and an anode thereof may be connected to the second node N2. The third diode Di3 may be connected between the output terminal Nout and the fourth switch SW4. An anode of the third diode Di3 may be connected to the output terminal Nout, and a cathode thereof may be connected to the fourth switch SW4.

When the first and second switches SW1 and SW2 are turned on, and the third and fourth switches SW3 and SW4 are turned off, the pulse circuit 110a may output a positive first voltage V1. When the third and fourth switches SW3 and SW4 are turned on, and the first and second switches SW1 and SW2 are turned off, the pulse circuit 110a may output a negative second voltage V2. When the second switch SW2 is turned on and the first, third, and fourth switches SW1, SW3, and SW4 are turned off, or when the third switch SW3 is turned on and the first, second, and fourth switches SW1, SW2, and SW4 are turned off, the pulse circuit 110a may output a ground (GND) voltage or a voltage of 0. Accordingly, the pulse circuit 110a may output voltages of three different levels.

The slope circuit 110b may include a third voltage source VS3, fifth through seventh switches SW5, SW6, and SW7, a fourth diode Di4, and an inductor L.

A negative terminal of the third voltage source VS3 may be connected to a reference terminal Nref. The third voltage source VS3 may output a third voltage V3. The third voltage source VS3 may be a DC voltage source or may output a variable voltage.

The fifth switch SW5 may be connected between a negative terminal of the third voltage source VS3 and a third node N3, and may be controlled by a fifth gate driving signal G5. The sixth switch SW6 may be connected between the reference terminal Nref and a fourth node N4, and may be controlled by a sixth gate driving signal G6. The seventh switch SW7 may be connected between the fourth node N4 and the output terminal Nout, and may be controlled by a seventh gate driving signal G7.

The fourth diode Di4 may be connected between the third node N3 and the reference terminal Nref. An anode of the fourth diode Di4 may be connected to the third node N3, and a cathode thereof may be connected to the reference terminal Nref.

The slope circuit 110b may charge the inductor L by using the third voltage source VS3, as will be described later, and then changes a voltage of the chamber CB by taking a current out of the chamber CB, thereby implementing a slope voltage.

The inductor L may be connected between the third node N3 and the fourth node N4. The inductor L may have inductance that is determined according to the values of the first through third voltages V1, V2, and V3.

According to some embodiments, the first through seventh switches SW1, SW2, SW3, . . . , and SW7 may be power semiconductor devices. A power semiconductor device is used to convert or control power, and may be referred to as a power device. As illustrated in FIG. 2, the first through seventh switches SW1, SW2, SW3, . . . , and SW7 are insulated gate bipolar transistors (IGBTs). Other switches may be used, e.g., the first through seventh switches SW1, SW2, SW3, . . . , and SW7 may be power Metal Oxide Semiconductor Field Effect transistors (MOSFETs). The controller 120 of FIG. 1 may generate the first through seventh gate driving signals G1, G2, G3, . . . , and G7 to control the first through seventh switches SW1, SW2, SW3, . . . , and SW7.

Figure 3:
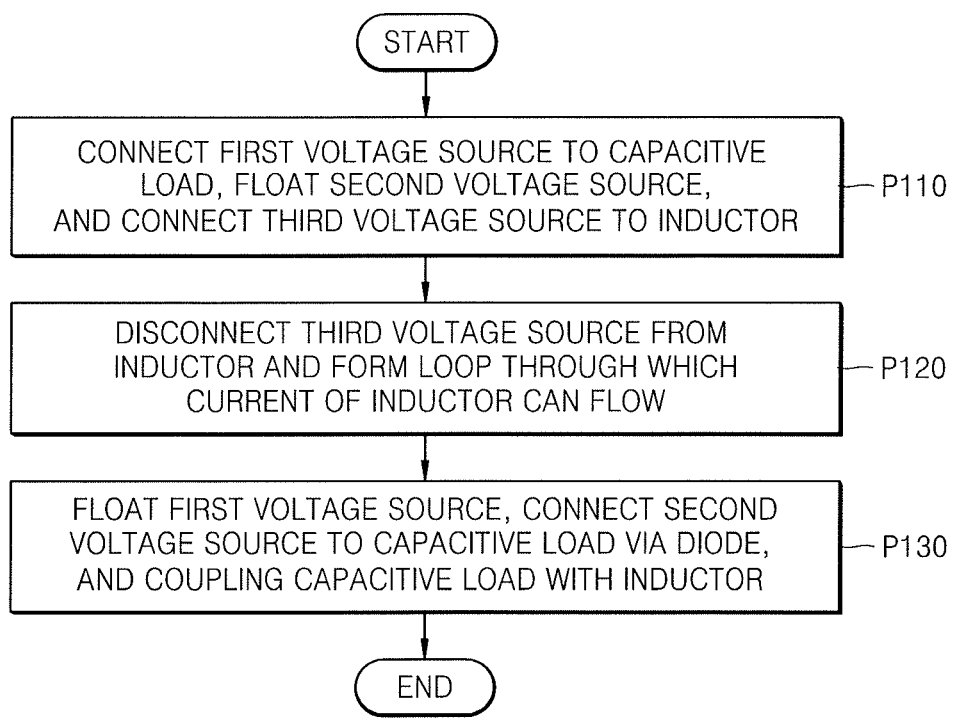
FIG. 3 illustrates a flowchart of a voltage waveform generation method using a voltage generator, according to some embodiments.
Figure 4B:
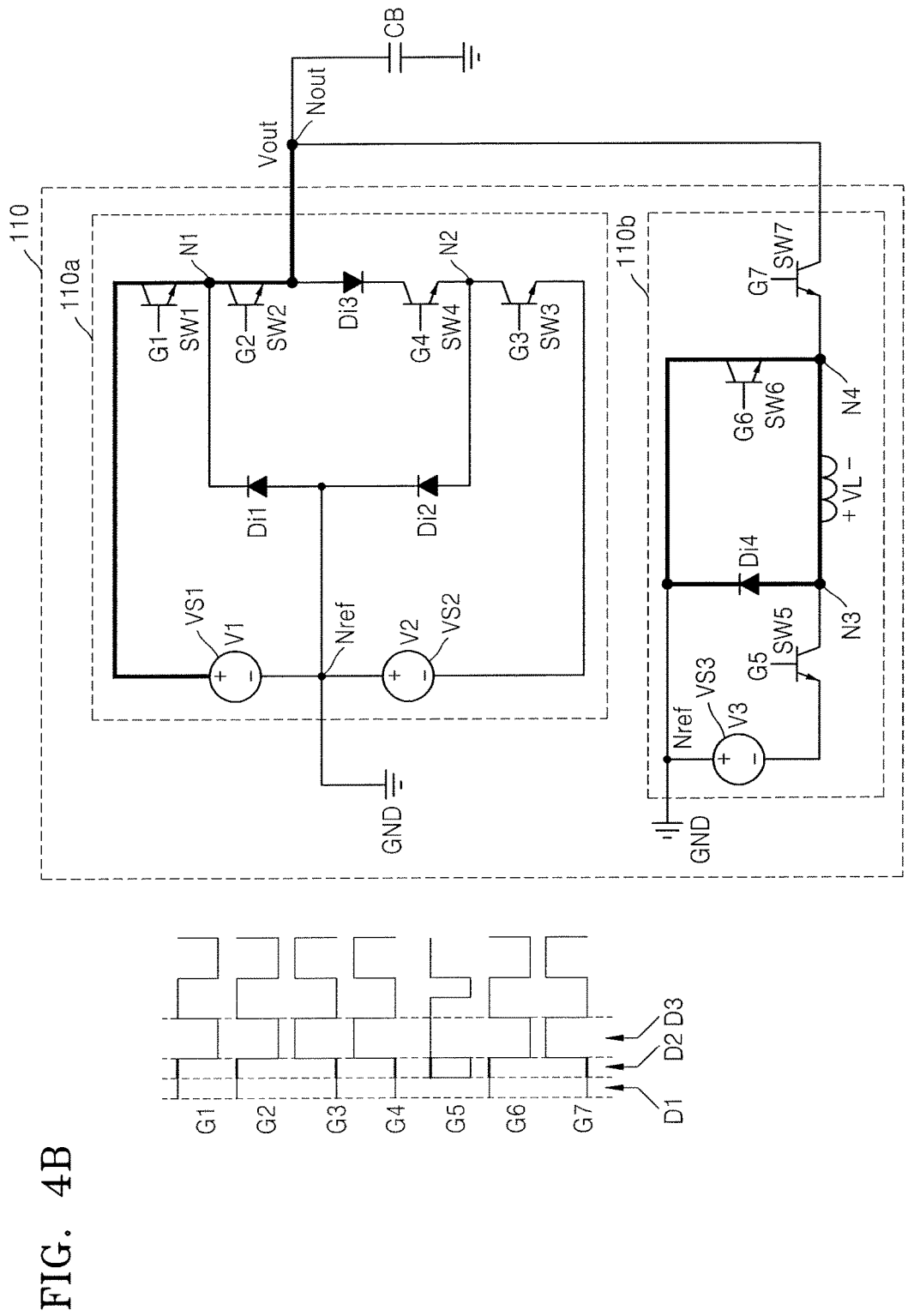
Figure 4C:
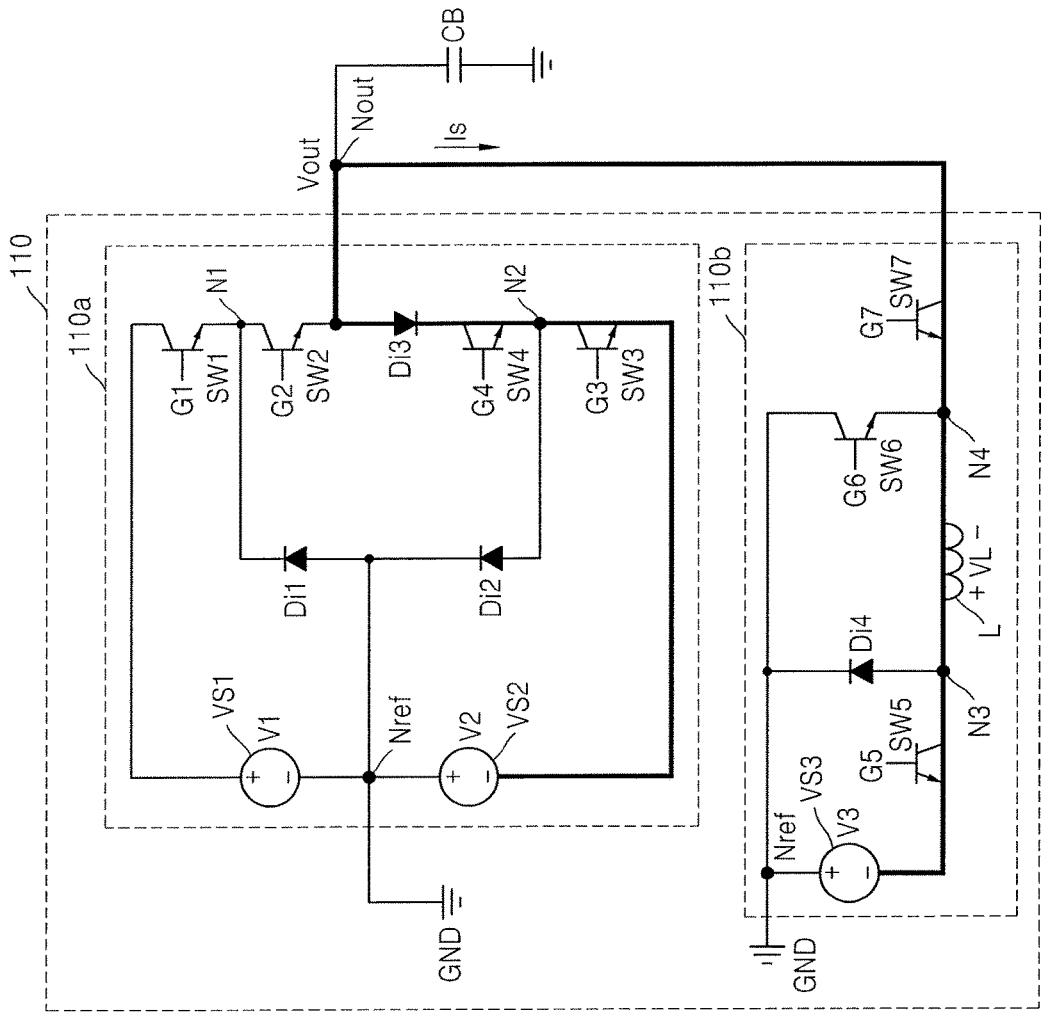

FIG. 3 is a flowchart of a voltage waveform generating method using the voltage generator 110, according to some embodiments. FIGS. 4A through 4C are circuit diagrams for explaining an operation of the voltage generator 110 of FIG. 2.

Referring to FIGS. 1, 3, and 4A, in P110, the controller 120 may apply 1 to the first, second, fifth, and sixth gate driving signals G1, G2, G5, and G6, and may apply 0 to the third, fourth, and seventh gate driving signals G3, G4, and G7, during a first section D1. Accordingly, the first, second, fifth, and sixth switches SW1, SW2, SW5, and SW6 are turned on, and the third, fourth, and seventh switches SW3, SW4, and SW7 are turned off. Thus, electrical paths as indicated by bold lines in FIG. 4A are formed.

The positive terminal of the first voltage source VS1 is connected to the output terminal Nout, e.g., the capacitive load, via the first and second switches SW1 and SW2. Accordingly, the first voltage V1 is applied as the output voltage Vout. A closed path passing through the second voltage source VS2 is not formed. Thus, the second voltage source VS2 is floated. A path including the third voltage source VS3, the inductor L, and the fifth and sixth switches SW5 and SW6 is formed. Thus, the inductor L is connected to and charged by the third voltage source VS3.

Referring to FIGS. 1, 3, and 4B, in P120, the controller 120 may apply 1 to the first, second, and sixth gate driving signals G1, G2, and G6, and may apply 0 to the third, fourth, fifth, and seventh gate driving signals G3, G4, G5, and G7, during a second interval D2. Accordingly, the first, second, and sixth switches SW1, SW2, and SW6 are turned on, and the third, fourth, fifth, and seventh switches SW3, SW4, SW5, and SW7 are turned off. Thus, electrical paths as indicated by bold lines in FIG. 4B are formed.

The first voltage V1 may be applied to the output terminal Nout via the first and second switches SW1 and SW2. A closed path passing through the second and third voltage sources VS2 and V3 is not formed, and thus the second and third voltage sources VS2 and VS3 may be floated. A closed path including the inductor L, the fourth diode Di4, and the sixth switch SW6 is formed, such that the current of the inductor L continuously flows, e.g., a loop is formed.

Referring to FIGS. 1, 3, and 4C, in P130, the controller 120 may apply 1 to the third, fourth, fifth, and seventh gate driving signals G3, G4, G5, and G7, and may apply 0 to the first, second, and sixth gate driving signals G1, G2, and G6, during a third interval D3. Accordingly, the third, fourth, fifth, and seventh switches SW3, SW4, SW5, and SW7 are turned on, and the first, second, and sixth switches SW1, SW2, and SW6 are turned off. Thus, an electrical path as indicated by a bold line in FIG. 4C is formed.

A closed path passing through the first voltage source VS1 is not formed. Thus, the first voltage source VS1 is floated. The negative terminal of the second voltage source VS2 is connected to the output terminal Nout via the third and fourth switches SW3 and SW4. Because the positive terminal of the second voltage source VS2 is connected to the ground terminal GND, a negative second voltage V2 is applied as the output voltage Vout. The third voltage source VS3 and the inductor L are serially connected to each other between the reference terminal Nref and the output terminal Nout. The third voltage source VS3 is connected to the inductor L via the fifth switch SW5, such that the inductor L is connected to the output terminal Nout, e.g., the capacitive load, via the seventh switch SW7.

In this case, a current that is substantially the same as the current of the inductor L flows from the chamber CB modelled as a capacitive load into the slope circuit 110b. Accordingly, the chamber CB may have a voltage change according to Equation 1.

$$C_{CB} \frac{dVout}{dt} = IsC_{CB} \frac{dVout}{dt} = Is \qquad \text{Equation 1}$$

where $C_{CB}$ indicates an equivalent capacitance of the chamber CB and Is indicates a current flowing from the chamber CB into the inductor L. In other words, the inductor L takes current out of the capacitive load of the chamber CB.

Accordingly, a voltage that is applied to the chamber CB becomes lower than a voltage provided by the second voltage source VS2 (i.e., the chamber CB has a negative voltage having an absolute value greater than that of the voltage provided by the second voltage source VS2). Thus, a slope may be formed in the output voltage Vout. According to some embodiments, due to an operation of the third diode Di3, a current may not substantially flow from the pulse circuit 110a to the chamber CB. In detail, due to a decrease in the output voltage Vout, the voltage of the cathode of the third diode Di3 becomes lower than that of the anode thereof. Thus, no current flows from the pulse circuit 110a to the chamber CB, e.g., current may flow from the chamber CB to only the slope circuit 110b.

Figure 5A:
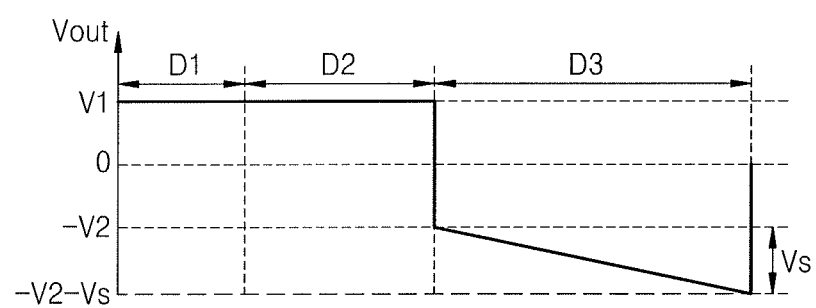
FIGS. 5A through 5C illustrate graphs for explaining how the voltage generator of FIG. 2 operates.
Figure 5B:
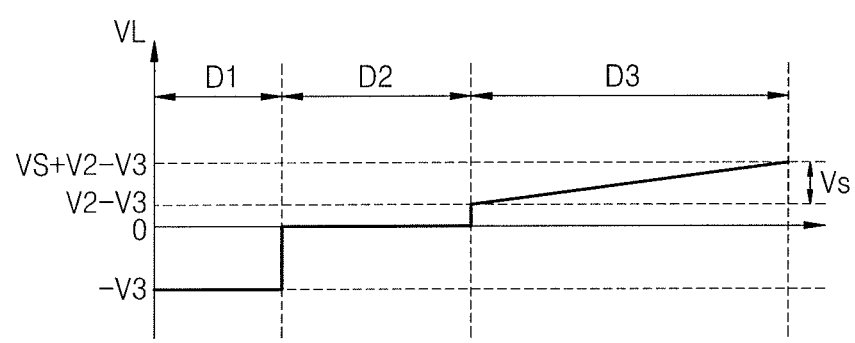
Figure 5C:
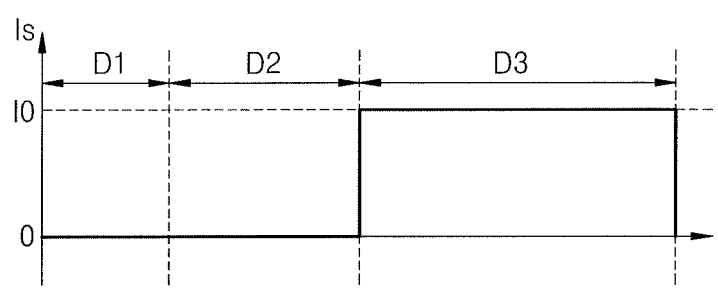

FIGS. 5A through 5C are graphs for explaining how the voltage generator 110 of FIG. 2 operates. In detail, FIG. 5A is a graph showing an output voltage Vout of the output terminal Nout over time during each of the first, second, and third intervals D1, D2, and D3 of FIGS. 4A through 4C. FIG. 5B is a graph showing a voltage VL on both ends of the inductor L over time during each of the first, second, and third intervals DE D2, and D3 of FIGS. 4A through 4C. FIG. 5C is a graph showing a current Is flowing from a chamber to a slope circuit over time during each of the first, second, and third intervals DE D2, and D3 of FIGS. 4A through 4C.

Referring to FIGS. 4A through 5A, during the first and second intervals D1 and D2, the first voltage source VS1 is connected to the output terminal Nout via the first and second switches SW1 and SW2. Thus, the output voltage Vout may be substantially the same as the first voltage V1.

Then, during the third interval D3, the voltage change according to Equation 1 occurs due to the current flowing out of the chamber CB, which is a capacitive load, and a size or magnitude of a change in the output voltage Vout during the third interval D3, i.e., a difference between a maximum value and a minimum value of the output voltage Vout during the third interval D3, is indicated by Vs. Referring to FIG. 5A, the output voltage Vout is illustrated as decreasing from a negative value so as to increase the absolute value or magnitude of the output voltage Vout. Alternatively, the output voltage Vout may increase from a positive value.

Referring to FIGS. 4A through 4C and FIG. 5B, during the first interval D1, the inductor L is charged by the third voltage source VS3. Thus, the voltage of the third voltage source VS3 is applied to the inductor L. During the second interval D2, no voltage is applied. During the third interval D3, a voltage corresponding to a difference between the output voltage Vout and the third voltage V3 may be applied.

When a circuit starts operating and reaches a normal state after lapse of a sufficient time period, the current of the inductor L has periodicity. Thus, a result of integration of the voltage applied on both ends of the inductor L for one cycle may be 0, as shown in Equation 2.

$$\int_0^{D1+D2+D3} VLdt =$$
$$-V3*D1 + 0*D2 + \left(-(-V2) - V3 + \frac{1}{2}Vs\right)D3 = 0$$
$$\int_0^{D1+D2+D3} VLdt =$$
$$-V3*D1 + 0*D2 + \left(-(-V2) - V3 + \frac{1}{2}Vs\right)D3 = 0$$

Equation 2

When Equation 2 is arranged with respect to Vs, Equation 3 below is obtained.

$$Vs = 2\left(1 + \frac{D1}{D3}\right)V3 - 2V2Vs = 2\left(1 + \frac{D1}{D3}\right)V3 - 2V2$$

Equation 3

Accordingly, the magnitude of Vs may be controlled by adjusting a length of the first interval D1 and the magnitudes of the second and third voltages V2 and V3. When a sum of the lengths of the first through third intervals D1, D2, and D3 is constant, a ratio of the length of the first interval D1 to that of the third interval D3 may be changed according to the length of the second interval D2. Thus, a slope voltage having various inclinations may be implemented. For example, when a length of a sum (D1+D2) of the first and second intervals D1 and D2 is maintained constant, the length of the second interval D2 is decreased, and the length of the first interval D1 is increased, the inclination of the slope voltage may increase. On the other hand, when the length of the sum (D1+D2) of the first and second intervals D1 and D2 is maintained constant, the length of the second interval D2 is increased, and the length of the first interval D1 is decreased, the inclination of the slope voltage may decrease.

When the controller 120 periodically applies the first through seventh gate driving signals G1, G2, G3, . . . , and G7 of the first through third intervals D1, D2, and D3 to the voltage generator 110, the voltage generator 110 may apply a periodic voltage waveform to the chamber CB.

Referring to FIGS. 4A through 4C and FIG. 5C, during the first and second intervals D1 and D2, an electrical path from the chamber CB to the slope circuit 110b is not formed. Thus, no current flows. During the third interval D3, an electrical path passing through the third voltage source VS3, the inductor L, and the chamber CB is formed. Thus, a current flows from the chamber CB to the slope circuit 110b. At this time, the inductance of the inductor L is determined in accordance with the values of the first through third voltages V1, V2, and V3, and the lengths of the first through third intervals D1, D2, and D3. Thus, during the third interval D3, the value of the current Is flowing from the chamber CB to the slope circuit 110b may be maintained as a current value JO that is substantially constant. Alternatively, the value of current flowing from the chamber CB to the slope circuit 110b during the third interval D3 may change.

Figure 6A:
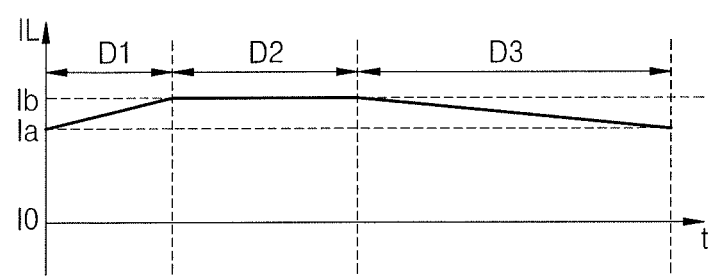
FIGS. 6A through 6C illustrate graphs for explaining a method of designing the voltage generator of FIGS. 1 and 2.
Figure 6B:
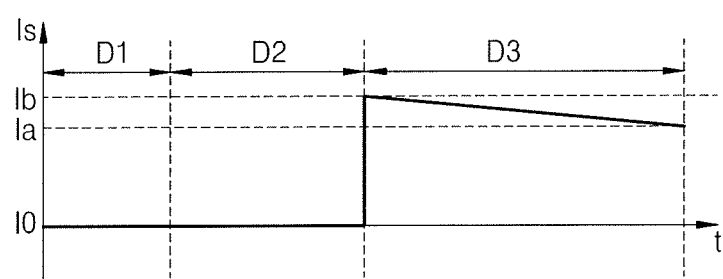
Figure 6C:
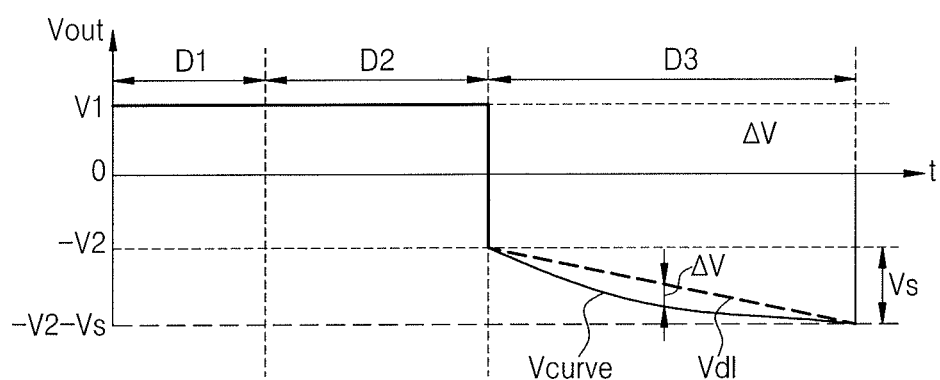

FIGS. 6A through 6C are graphs for explaining a method of designing the voltage generator 110 of FIGS. 1 and 2. In more detail, FIGS. 6A through 6C are graphs for explaining a method of determining the inductance of the inductor L included in the voltage generator 110 of FIGS. 1 and 2.

Referring to FIGS. 2, 4A through 4C, and 6A, an inductor current IL varies over time during each of the first through third intervals D1, D2, and D3 of FIGS. 4A through 4C. In contrast with FIG. 5B, the actual inductor current IL may increase during the first interval D1 due to application of the third voltage V3, may maintain a constant value during the second interval D2, and may decrease during the third interval D3. As described above, when the controller 120 applies the first through seventh gate driving signals G1, G2, G3, . . . , and G7 to the voltage generator 110 and, then, a sufficient time period lapses, the inductor current IL reaches a normal state. Thus, an increment of the inductor current IL during the first interval D1 may be substantially the same as a decrement thereof during the third interval D3. The value of the inductor current IL when the first interval D1 starts is indicated by Ia, and the value of the inductor current IL when the first interval D1 ends is indicated by Ib. Herein, Ia and Ib satisfy Equation 4 with respect to the third voltage V3.

$$Vs = 2\left(1 + \frac{D1}{D3}\right)V3 - 2V2Vs = 2\left(1 + \frac{D1}{D3}\right)V3 - 2V2$$

Equation 4 where La indicates the inductance of the inductor L. Referring to FIGS. 6A and 6B, when it is assumed that, during the third interval D3, the inductor current IL and the chamber current Is are the same, and the inductor current IL linearly changes, Equation 5 below may be obtained.

$$Is = IL = Ib + (Ia - Ib)\left(\frac{t - D1 - D2}{D3}\right) Is =$$   Equation 5

$$IL = Ib + (Ia - Ib)\left(\frac{t - D1 - D2}{D3}\right)$$

where t indicates time.

Referring to FIG. 6C, an output voltage Vout of the third interval D3 that varies according to the current of Equation 5 may have be curved relative to the output voltage Vout of the third interval D3 of FIG. 5A, and is referred to as a curved voltage Vcurve.

The curved voltage Vcurve according to Equation 5 becomes a second-order polynomial with respect to time, and a rectilinear voltage Vdl and the curved voltage Vcurve have the same value at a starting time point and an end time point of the third interval D3. When a first-order formula and a second-order formula meet at the two points via a differential operation, a maximum value of a difference between the rectilinear voltage Vdl and the curved voltage Vcurve appears at the center of the two points. Accordingly, when the maximum value of the difference between the rectilinear voltage Vdl and the curved voltage Vcurve is $\Delta V$, $\Delta V$ satisfies Equation 6.

$$C_{CB} * \Delta V = (ib - ia) * \frac{D3}{8} = \frac{V3 * D1}{La} * \frac{D3}{8}$$   Equation 6

When Equation 6 is solved for the inductance La, $$La = \frac{D1 * D3}{8 C_{CB}} * \frac{V3}{\Delta V}.$$

Accordingly, as the value of the inductance La increases, the output voltage Vout of the third interval D3 may be changed to an open form that is similar to a straight line. When the maximum value or an upper limit of the difference between the curved voltage Vcurve and the rectilinear voltage Vdl that are actually output is determined, the inductance value La may be accordingly determined.

Figure 7:
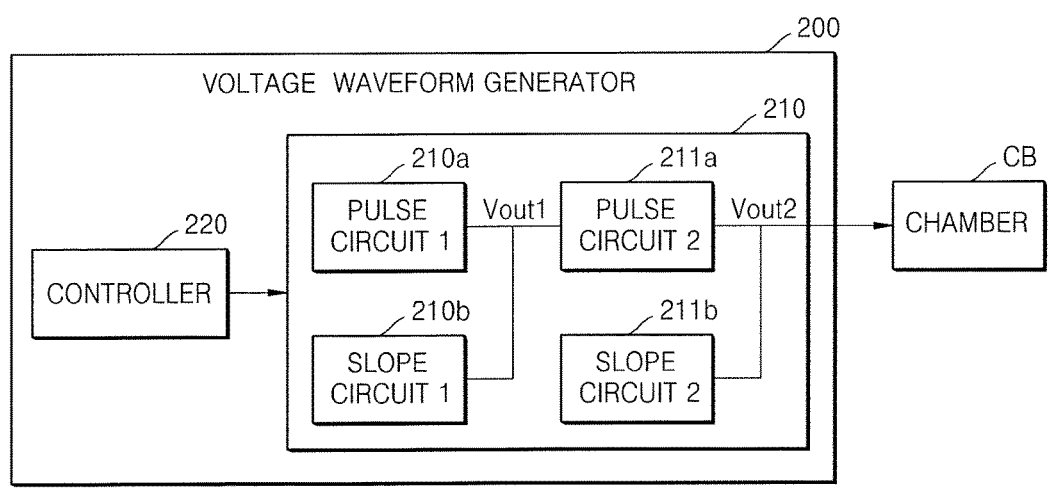
FIG. 7 illustrates a schematic block diagram of a semiconductor device manufacturing apparatus according to some embodiments.

FIG. 7 is a schematic block diagram of a semiconductor device manufacturing apparatus 20 according to some embodiments. For convenience of explanation, overlapping descriptions between the embodiments of FIGS. 1 and 7 will now be omitted, and differences therebetween will now be focused on and described.

Referring to FIG. 7, the semiconductor device manufacturing apparatus 20 may include a voltage waveform generator 200 and a chamber CB. The voltage waveform generator 200 may generate an output voltage Vout having a certain waveform set by a user, and provide the generated output voltage Vout to the chamber CB.

The voltage waveform generator 200 may include a voltage generator 210 and a controller 220. The voltage generator 210 may include first and second pulse circuits 210a and 211a, and first and second slope circuits 210b and 211b. The voltage generator 210 may be a circuit device for generating first and second output voltages Vout1 and Vout2. The first output voltage Vout1 may be an output voltage according to operation results of the first pulse circuit 210a and the first slope circuit 210b. According to some embodiments, the first output voltage Vout1 and the second output voltage Vout2 are the same as each other, and thus the first output voltage Vout1 may be applied to the chamber CB. According to some other embodiments, the first output voltage Vout1 and the second output voltage Vout2 are different from each other, and thus the first output voltage Vout1 may serve as a reference voltage of the second pulse circuit 211a. In this case, the second output voltage Vout2, different from the first output voltage Vout1, may be applied to the chamber CB.

Figure 8:
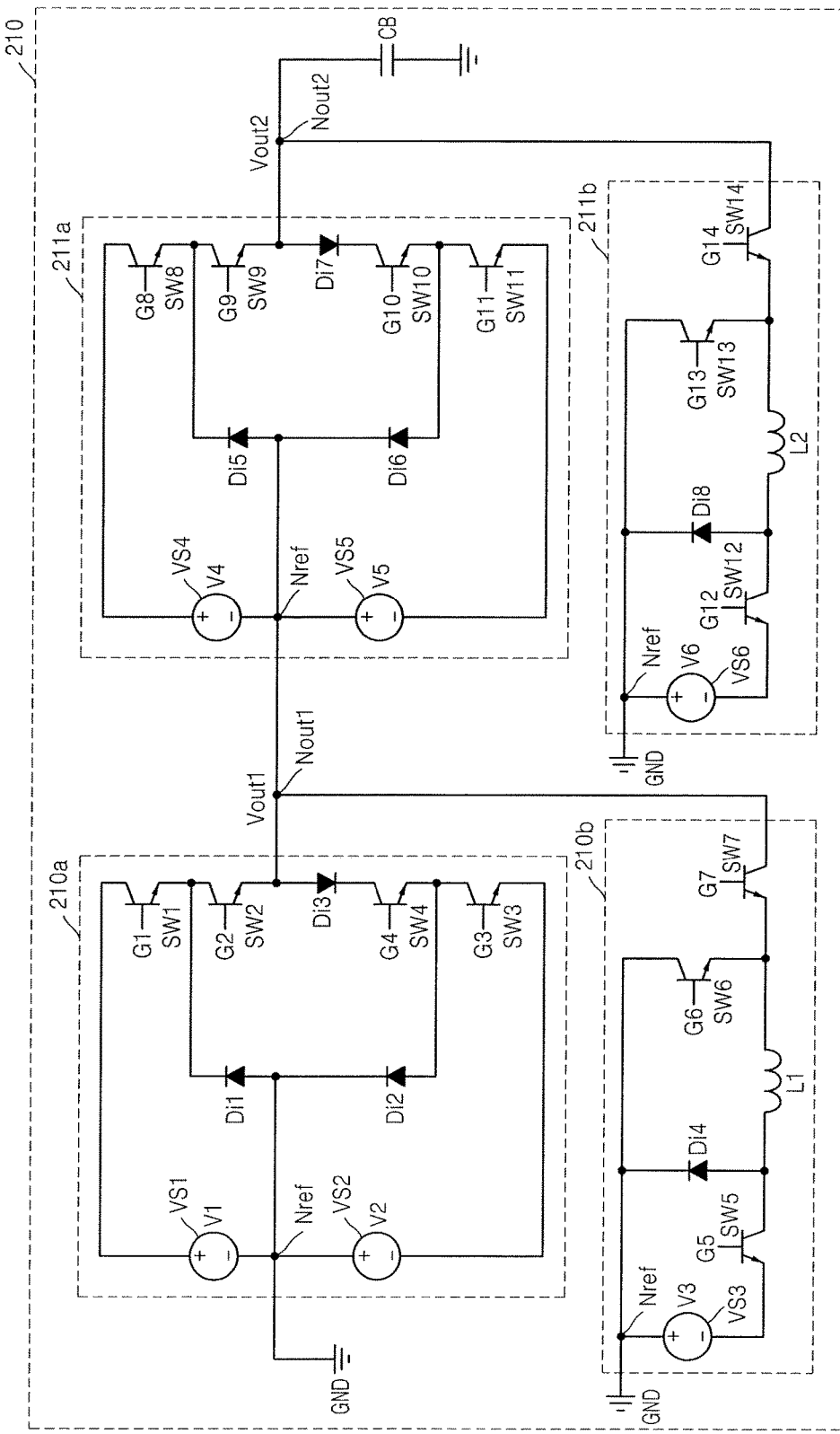
FIG. 8 illustrates a circuit diagram of a voltage generator of FIG. 7.

FIG. 8 is a circuit diagram of the voltage generator 210 of FIG. 7. Referring to FIG. 8, according to some embodiments, the first pulse circuit 210a and the first slope circuit 210b may be connected to each other in parallel.

According to some embodiments, the first pulse circuit 210a and the first slope circuit 210b may be connected to each other in parallel between a first output terminal Nout1 outputting the first output voltage Vout1 and a ground terminal GND providing a reference potential. The second pulse circuit 211a may be connected between the first output terminal Nout1 and a second output terminal Nout2 via which the second output voltage Vout2 is output. The second slope circuit 211b may be connected between the ground terminal GND and the second output terminal Nout2. The chamber CB may be connected to the second output terminal Nout2. In this case, the chamber CB may be modelled as a capacitive load, e.g., a capacitor.

The first pulse circuit 210a may include first and second voltage sources VS1 and VS2, first through third diodes Di1, Di2, and Di3, and first through fourth switches SW1, SW2, SW3, and SW4, and connection relationships therebetween are substantially the same as those in the pulse circuit 110a described above with reference to FIG. 2. The first slope circuit 210b may include a third voltage source VS3, fifth through seventh switches SW5, SW6, and SW7, a fourth diode Di4, and a first inductor L1, and connection relationships therebetween are substantially the same as those in the slope circuit 110b described above with reference to FIG. 2.

The second pulse circuit 211a may include fourth and fifth voltage sources VS4 and VS5, fifth through seventh diodes Di5, Di6, and Di7, and eighth through eleventh switches SW8, SW9, SW10, and SW11, and connection relationships therebetween are substantially the same as those in the pulse circuit 110a described above with reference to FIG. 2. The second slope circuit 211b may include a sixth the voltage source VS6, twelfth through fourteenth switches SW12, SW13, and SW14, an eighth diode Di8, and a second inductor L2, and connection relationships therebetween are substantially the same as those in the slope circuit 110b described above with reference to FIG. 2.

The first through fourteenth switches SW1, SW2, SW3, . . . , and SW14 may be sequentially controlled by first through fourteenth gate driving signals G1, G2, G3, . . . , and G14, respectively. The first through fourteenth gate driving signals G1, G2, G3, . . . , and G14 may be controlled by the controller 220 of FIG. 7. According to some embodiments, the first through fourteenth switches SW1, SW2, SW3, . . . , and SW14 may be IGBTs or power MOSFETs.

The first through sixth voltage sources VS1, VS2, VS3, VS4, VS5, and VS6 may sequentially output first through sixth the voltages V1, V2, V3, V4, V5, and V6, respectively.

The first through sixth voltage sources VS1, VS2, VS3, VS4, VS5, and VS6 may be DC voltage sources or may have variable values.

According to some embodiments, a magnitude of the fourth voltage V4 may be greater than that of the first voltage V1 a magnitude of the fifth voltage V5 may be greater than that of the second voltage V2, and a magnitude of the sixth voltage V6 may be greater than that of the third voltage V3. According to some embodiments, when the second pulse circuit 211a and the second slope circuit 211b outputting larger output voltages than the first pulse circuit 210a and the first slope circuit 210b are closer to the chamber CB than the first pulse circuit 210a and the first slope circuit 210b, a change in the voltage of the first output terminal Nout1 may be smaller than when the first pulse circuit 210a and the first slope circuit 210b are closer to the chamber CB than the second pulse circuit 211a and the second slope circuit 211b. Because the voltage of the first output terminal Nout1 serves as a reference for a voltage output by the second pulse circuit 211a, when a change in the voltage of the first output terminal Nout1 is large, energy loss due to the fourth through sixth voltage sources VS4, VS5, and VS6 may increase.

When the first pulse circuit 210a and the second pulse circuit 211a are serially connected to each other, switches included in the first pulse circuit 210a are not exposed to a high voltage, as when the pulse circuit 210a and the second pulse circuit 211a are connected in parallel. Thus, stress of the switches may be decreased and, accordingly, a lifespan and reliability of the voltage generator 210 may be improved.

Figure 9:
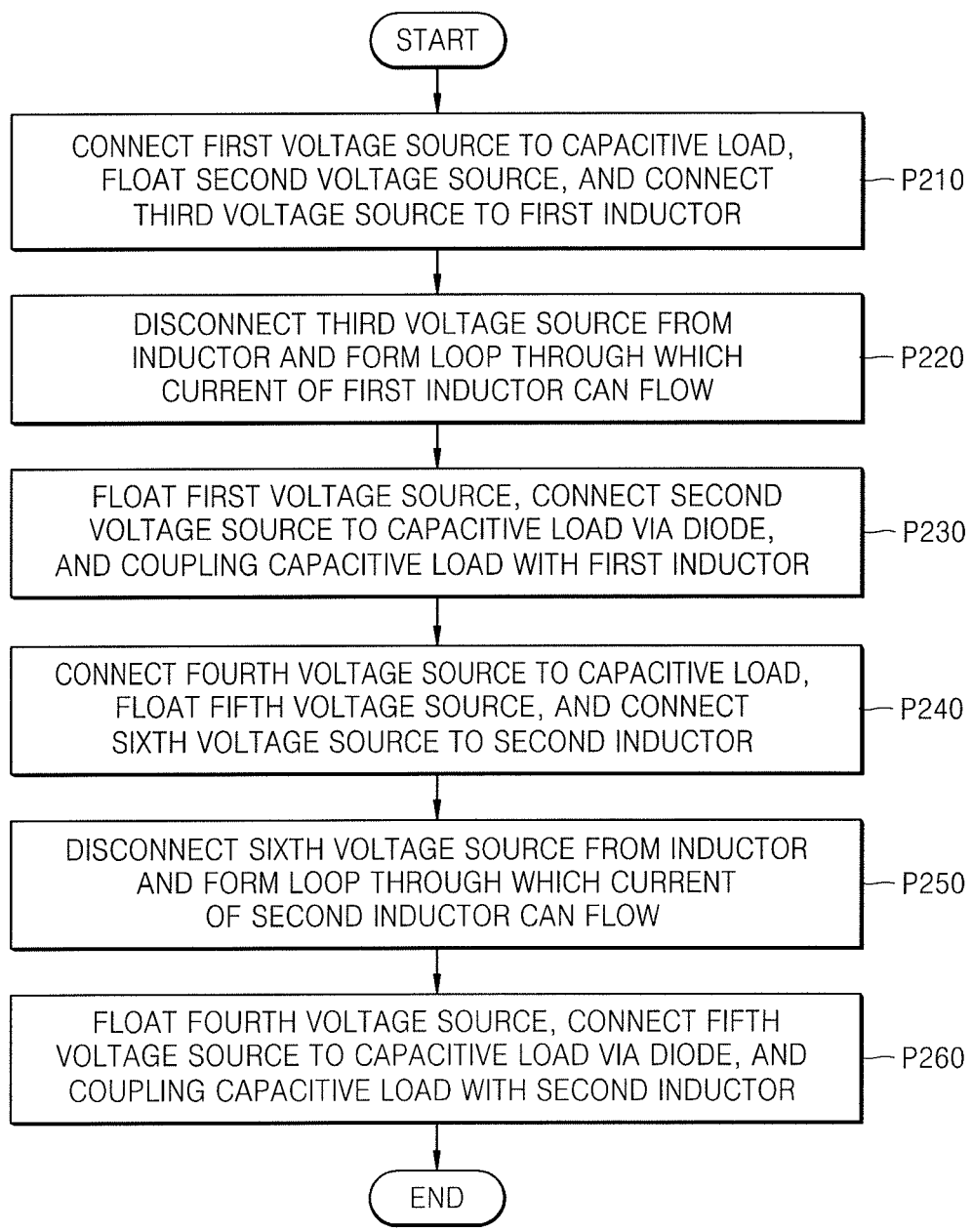
FIG. 9 illustrates a flowchart of a voltage waveform generation method using a voltage generator, according to some embodiments.
Figure 10:
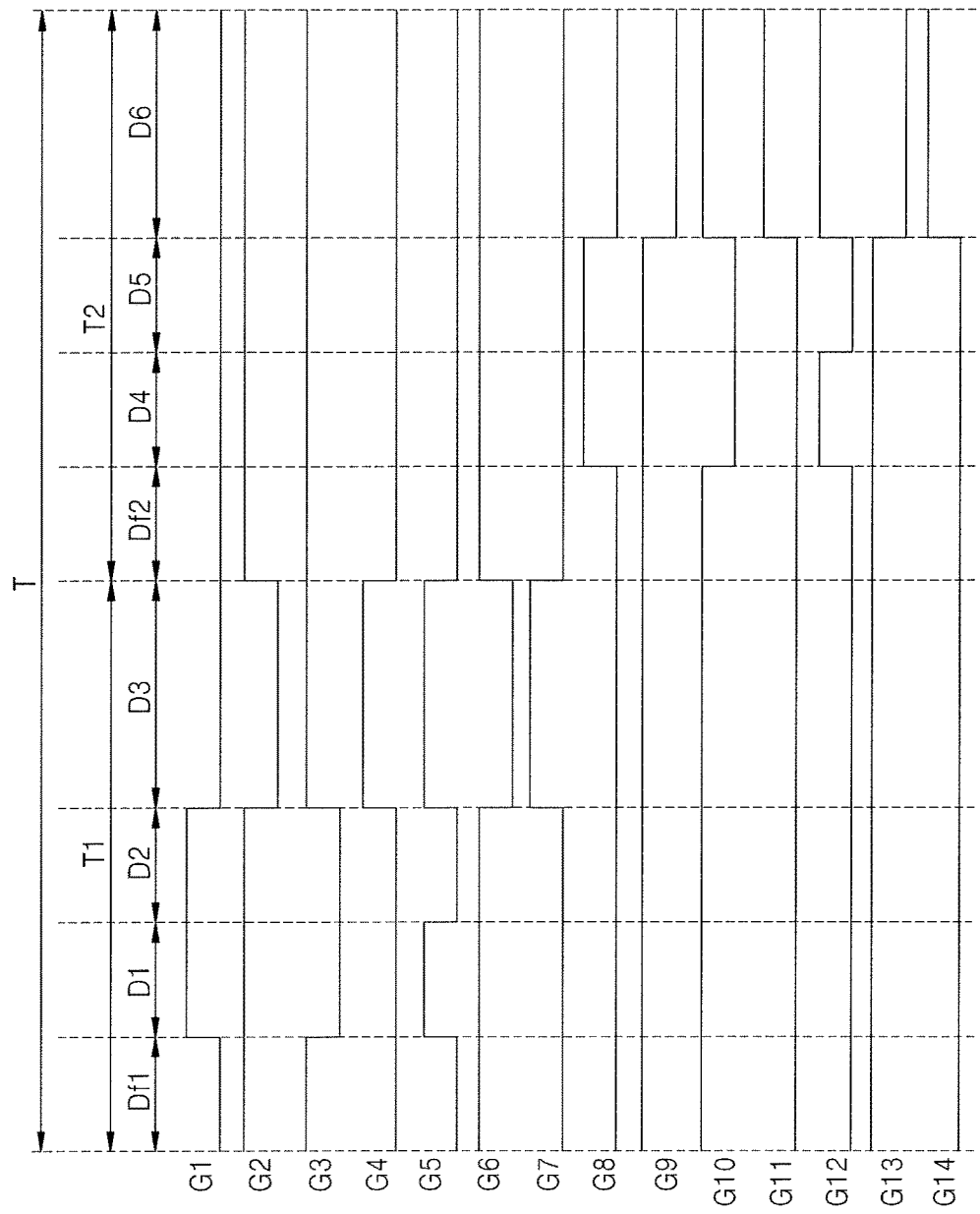
FIG. 10 illustrates a graph illustrating how the voltage generator of FIG. 8 operates.

FIG. 9 is a flowchart of a voltage waveform generating method using the voltage generator 210, according to some embodiments. FIG. 10 is a graph showing gate driving signals that are applied to the voltage generator 210. FIGS. 11 through 18 are circuit diagrams illustrating electrical paths according to activations of switches within the voltage generator 210.

First, referring to FIGS. 7 and 10, the controller 220 may control the first through fourteenth gate driving signals G1, G2, G3, . . . , and G14 to be periodically repeated. One period T may include a first period T1 and a second period T2 that occur sequentially. The first period T1 may include a first inactive interval Df1 and the first through third interval D1, D2, and D3, and the second period T2 may include a second inactive interval Df2 and the fourth through sixth intervals D4, D5, and D6. Alternatively, when the first inactive interval Df1 is omitted, the first interval D1 of a current period T may occur after the sixth interval D6 of a previous period T, and, when the second inactive interval Df2 is omitted, the third interval D3 may be followed by the fourth interval D4.

Figure 11:
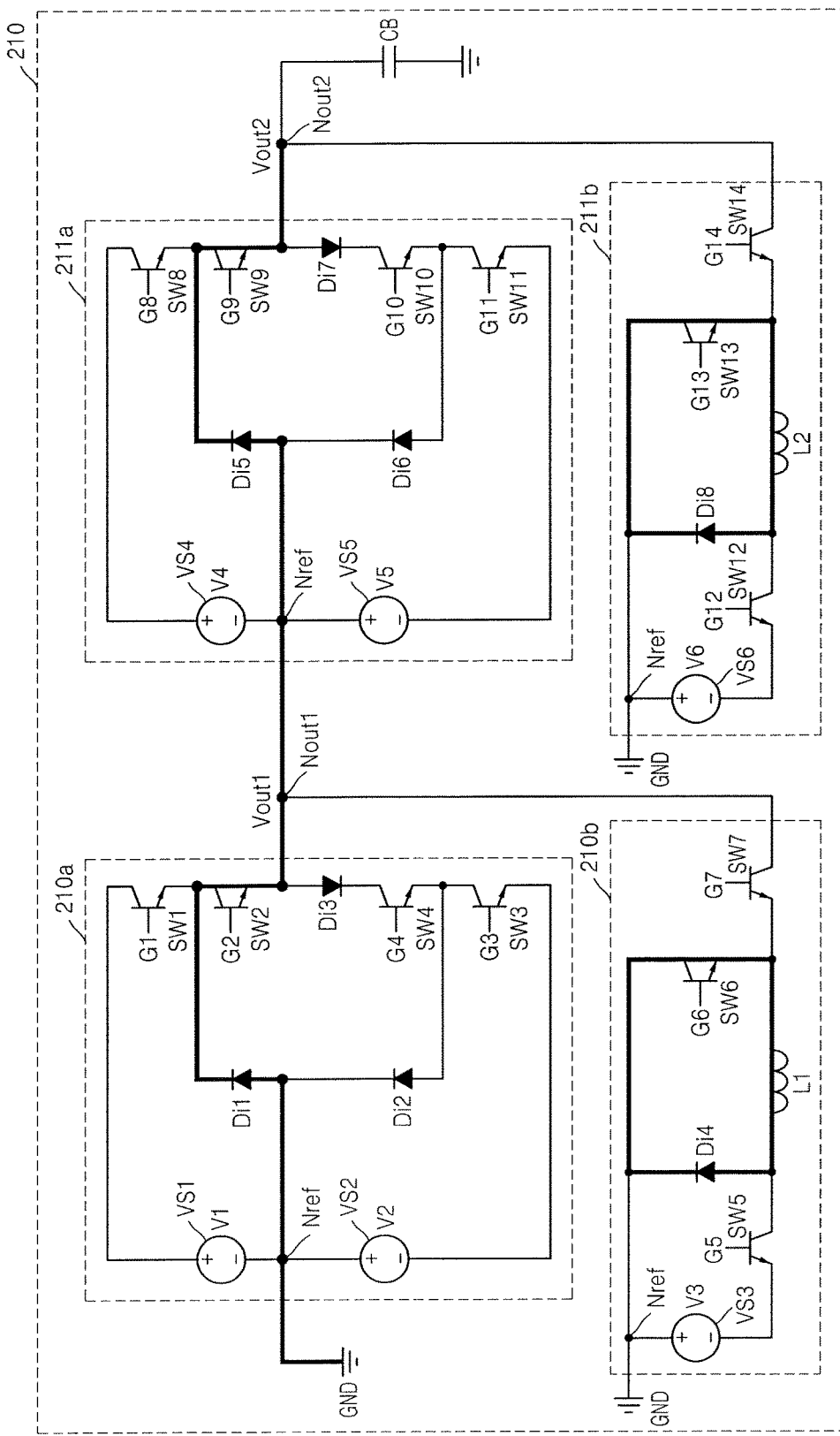
FIGS. 11 through 18 illustrate circuit diagrams for explaining how the voltage generator of FIG. 8 operates.

Referring to FIGS. 7, 9, 10, and 11, during the first inactive interval Df1, the controller 220 may apply 1 to the second, third, sixth, ninth, tenth, and thirteenth gate driving signals G2, G3, G6, G9, G10, and G13, and may apply 0 to the first, fourth, fifth, seventh, eighth, eleventh, twelfth, and fourteenth gate driving signals G1, G4, G5, G7, G8, G11, G12, and G14. Accordingly, the second, third, sixth, ninth, tenth, and thirteenth switches SW2, SW3, SW6, SW9, SW10, and SW13 are turned on, and the first, fourth, fifth, seventh, eighth, eleventh, twelfth, and fourteenth switches SW1, SW4, SW5, SW7, SW8, SW11, SW12, and SW14 are turned off. Thus electrical paths as indicated by bold lines in FIG. 11 are formed. Accordingly, each of the first and second output terminals Nout1 and Nout2 may be connected to the ground terminal GND, and potential of the ground terminal GND may be applied to the chamber CB. Because the first inductor L1 forms a closed electrical path together with the sixth switch SW6 and the fourth diode Di4, and the second inductor L2 forms a closed electrical path together with the thirteenth switch SW13 and the eighth diode Di8, a current flowing in the first and second inductors L1 and L2 is constant.

Figure 12:
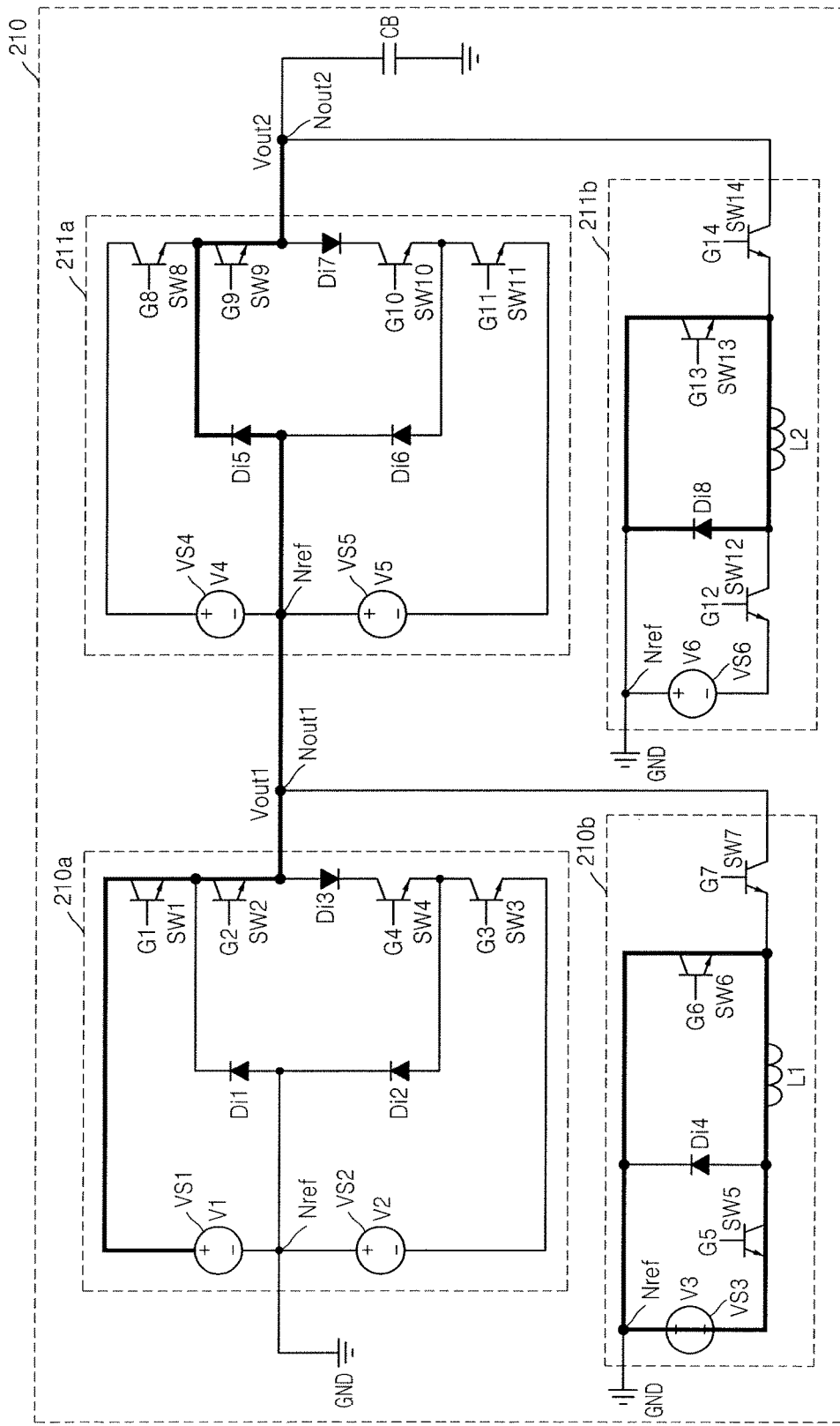

Referring to FIGS. 7, 9, 10, and 12, in P210, the controller 220 may apply 1 to the first, second, fifth, sixth, ninth, tenth, and thirteenth gate driving signals G1, G2, G5, G6, G9, G10, and G13, and may apply 0 to the third, fourth, seventh, eighth, eleventh, twelfth, and fourteenth gate driving signals G3, G4, G7, G8, G11, G12, and G14, during the first interval D1. Accordingly, the first, second, fifth, sixth, ninth, tenth, and thirteenth switches SW1, SW2, SW5, SW6, SW9, SW10, and SW13 are turned on, and the third, fourth, seventh, eighth, eleventh, twelfth, and fourteenth switches SW3, SW4, SW7, SW8, SW11, SW12, and SW14 are turned off. Thus, electrical paths as indicated by bold lines in FIG. 12 are formed. At this time, operations of the first pulse circuit 210a and the first slope circuit 210b may be substantially the same as those of the pulse circuit 110a and the slope circuit 110b of FIG. 4A, respectively. In particular, the second pulse circuit 211a and the second slope circuit 211b do not affect Vout1 such the first and second output terminals Nout1 and Nout2 receive a same voltage. A current flowing in the second inductor L2 may be constant, similar to FIG. 11.

Figure 13:
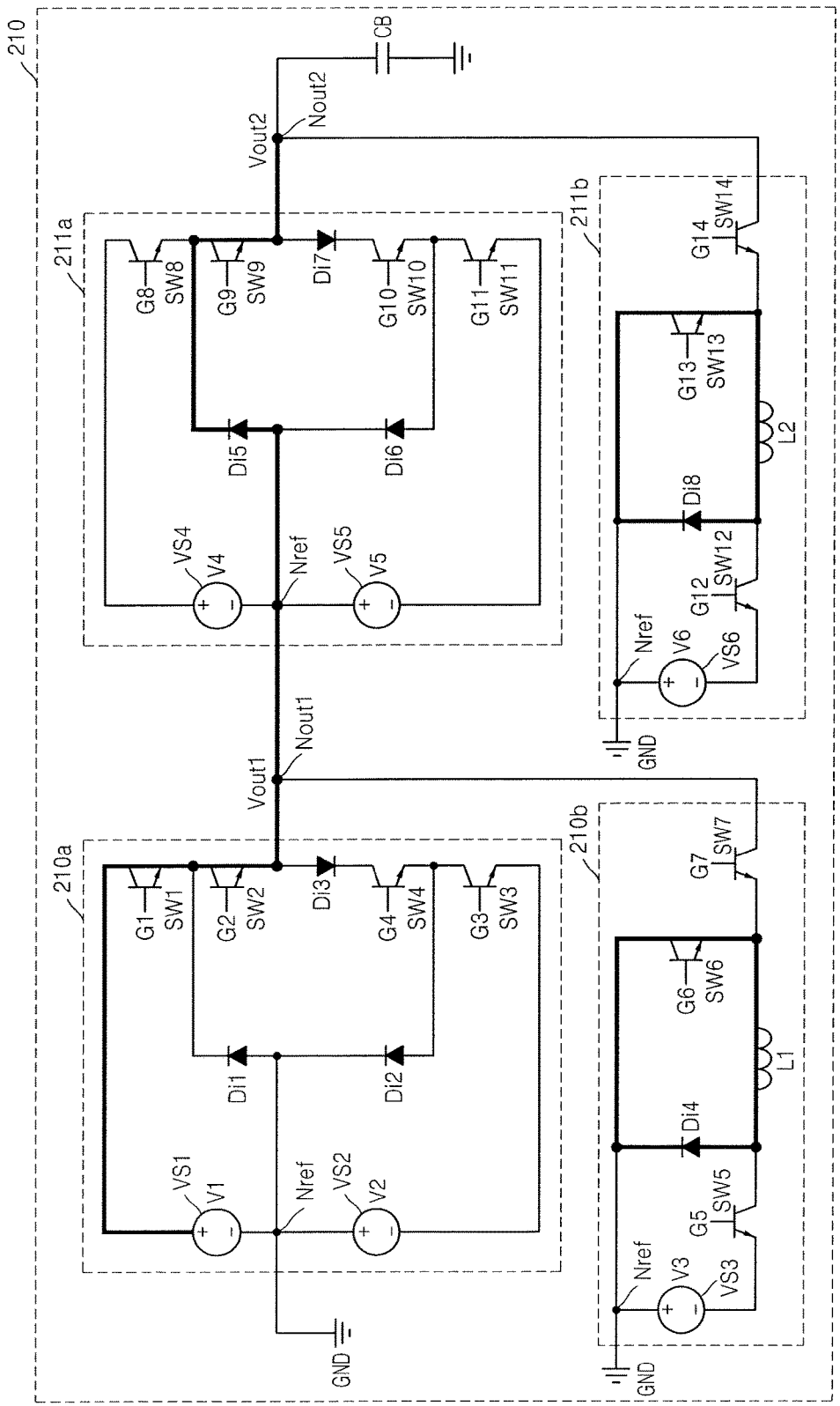

Referring to FIGS. 7, 9, 10, and 13, in P220, the controller 220 may apply 1 to the first, second, sixth, ninth, tenth, and thirteenth gate driving signals G1, G5, G6, G9, G10, and G13, and may apply 0 to the third, fourth, fifth, seventh, eighth, eleventh, twelfth, and fourteenth gate driving signals G3, G4, G5, G7, G8, G11, G12, and G14, during the second interval D2. Accordingly, the first, second, sixth, ninth, tenth, and thirteenth switches SW1, SW2, SW6, SW9, SW10, and SW13 are turned on, and the third, fourth, fifth, seventh, eighth, eleventh, twelfth, and fourteenth switches SW3, SW4, SW5, SW7, SW8, SW11, SW12, and SW14 are turned off. Thus electrical paths as indicated by bold lines in FIG. 13 are formed. At this time, operations of the first pulse circuit 210a and the first slope circuit 210b may be substantially the same as those of the pulse circuit 110a and the slope circuit 110b of FIG. 4B, respectively. In particular, the second pulse circuit 211a and the second slope circuit 211b do not affect Vout1 such the first and second output terminals Nout1 and Nout2 receive a same voltage. A current flowing in the second inductor L2 may be constant, similar to FIG. 11.

Figure 14:
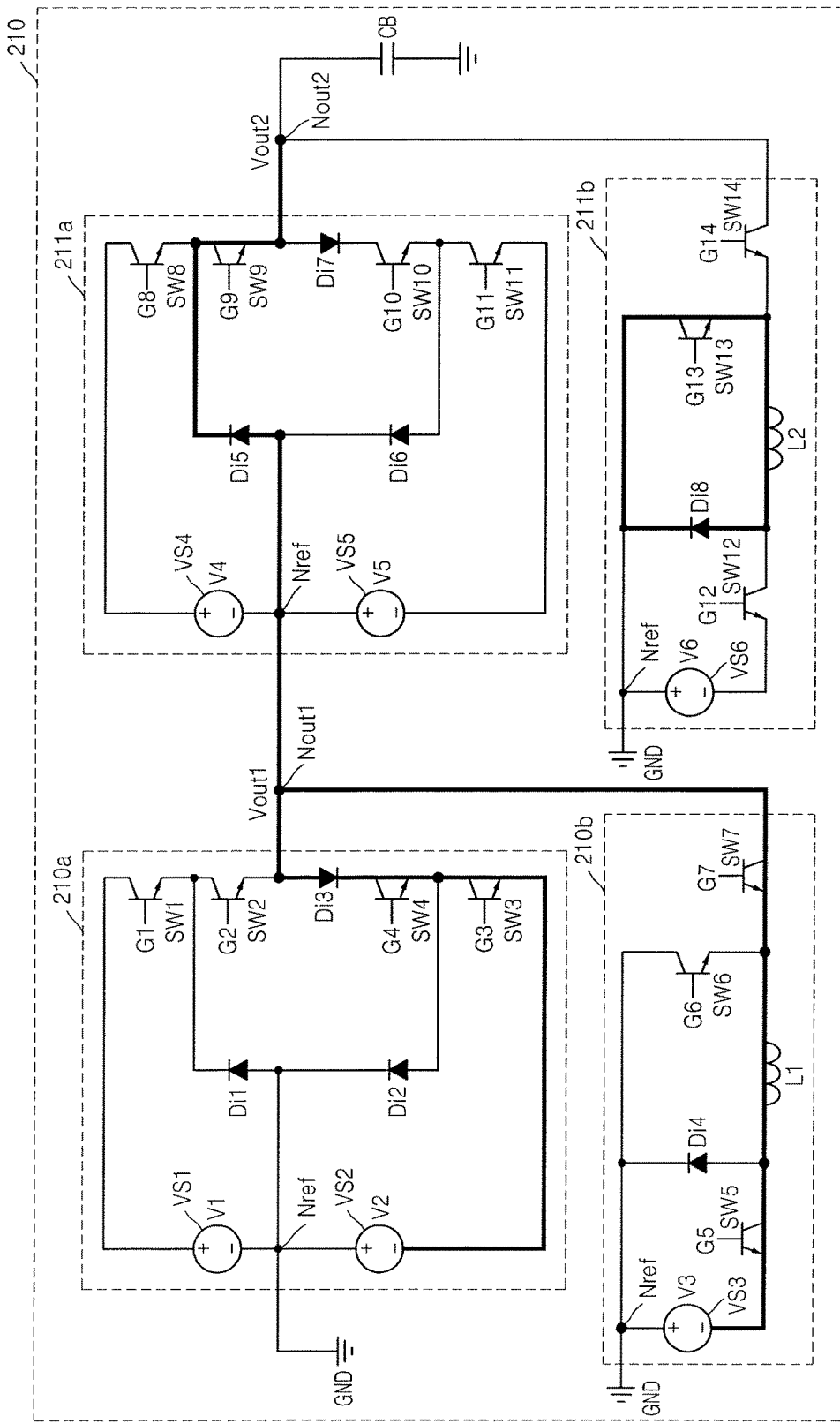
Figure 15:
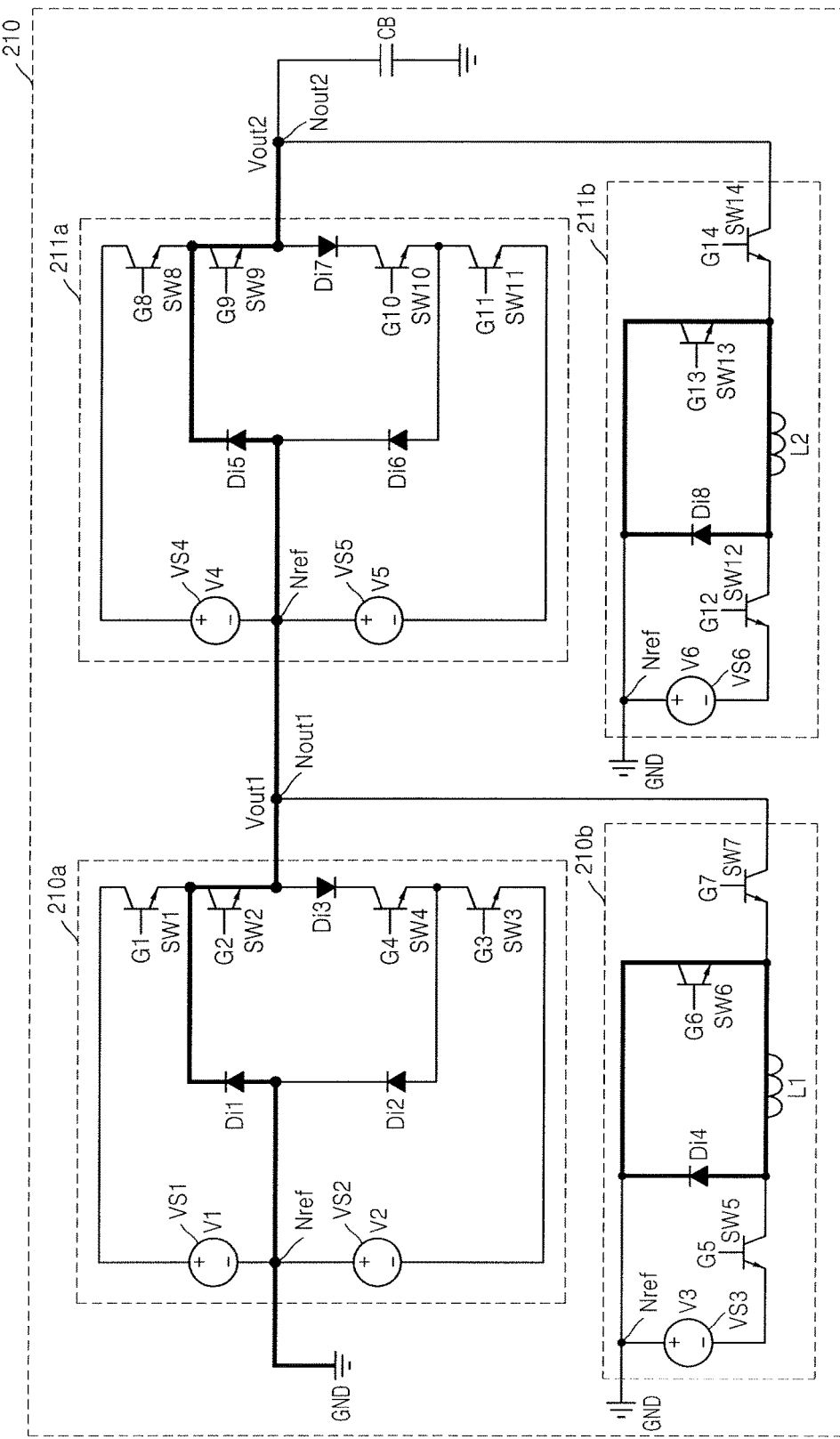

Referring to FIGS. 7, 9, 10, and 14, in P230, the controller 220 may apply 1 to the third, fourth, fifth, seventh, ninth, tenth, and thirteenth gate driving signals G3, G4, G5, G7, G9, G10, and G13, and may apply 0 to the first, second, sixth, eighth, eleventh, twelfth, and fourteenth gate driving signals G1, G2, G6, G8, G11, G12, and G14, during the third interval D3. Accordingly, the third, fourth, fifth, seventh, ninth, tenth, and thirteenth switches SW3, SW4, SW5, SW7, SW9, SW10, and SW13 are turned on, and the first, second, sixth, eighth, eleventh, twelfth, and fourteenth switches SW1, SW2, SW6, SW8, SW11, SW12, and SW14 are turned off. Thus, electrical paths as indicated by bold lines in FIG. 14 are formed. At this time, operations of the first pulse circuit 210a and the first slope circuit 210b may be substantially the same as those of the pulse circuit 110a and the slope circuit 110b of FIG. 4C, respectively. In particular, the second pulse circuit 211a and the second slope circuit 211b do not affect Vout1 such the first and second output terminals Nout1 and Nout2 receive a same voltage. Accordingly, a current Is1 may flow from the chamber CB to the first inductor L1, e.g., the first inductor L1 takes current out of the chamber CB, and a voltage applied on both ends of the chamber CB, namely, a voltage between the second output terminal Nout2 and the ground terminal GND, changes.

Referring to FIGS. 7, 9, 10, and 15, during the second inactive interval Df2, the controller 220 may output gate driving signals that are substantially the same as those during the first inactive interval Df1, and accordingly, potential of the ground terminal GND may be applied to the chamber CB.

Figure 16:
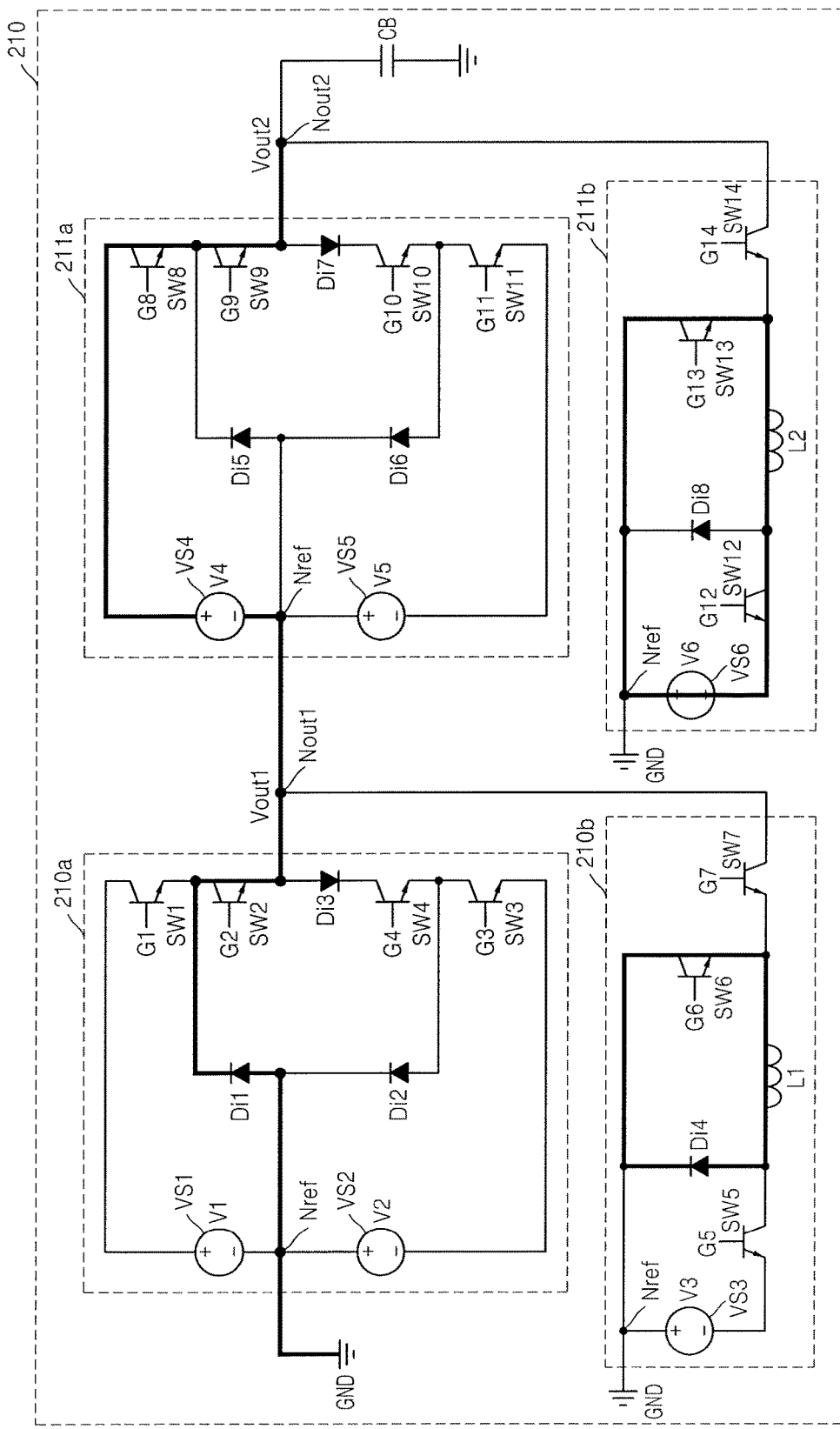

Referring to FIGS. 7, 9, 10, and 16, in P240, the controller 220 may apply 1 to the second, third, sixth, eighth, ninth, twelfth, and thirteenth gate driving signals G2, G3, G6, G8, G9, G12, and G13, and may apply 0 to the first, fourth, fifth, seventh, tenth, eleventh, and fourteenth gate driving signals G1, G4, G5, G7, G10, G11, and G14, during the fourth interval D4. Accordingly, the second, third, sixth, eighth, ninth, twelfth, and thirteenth switches SW2, SW3, SW6, SW8, SW9, SW12, and SW13 are turned on, and the first, fourth, fifth, seventh, tenth, eleventh, and fourteenth switches SW1, SW4, SW5, SW7, SW10, SW11, and SW14 are turned off. Thus, electrical paths as indicated by bold lines in FIG. 16 are formed, and the fourth voltage source VS4 is connected to the capacitive load, the fifth voltage source VS5 is floated, and the sixth voltage source VS6 is connected to the second inductor L2. A current flowing in the first inductor L1 may be constant, similar to FIG. 11.

At this time, because the first output terminal Nout1 is connected to the ground terminal GND via the first diode Di1 and the second switch SW2, potential of the first output terminal Nout1 may be substantially the same as the potential of the ground terminal GND. Accordingly, operations of the second pulse circuit 211a and the second slope circuit 211b may be substantially the same as those of the pulse circuit 110a and the slope circuit 110b of FIG. 4A, respectively. A current flowing in the first inductor L1 may be constant, similar to FIG. 11.

Figure 17:
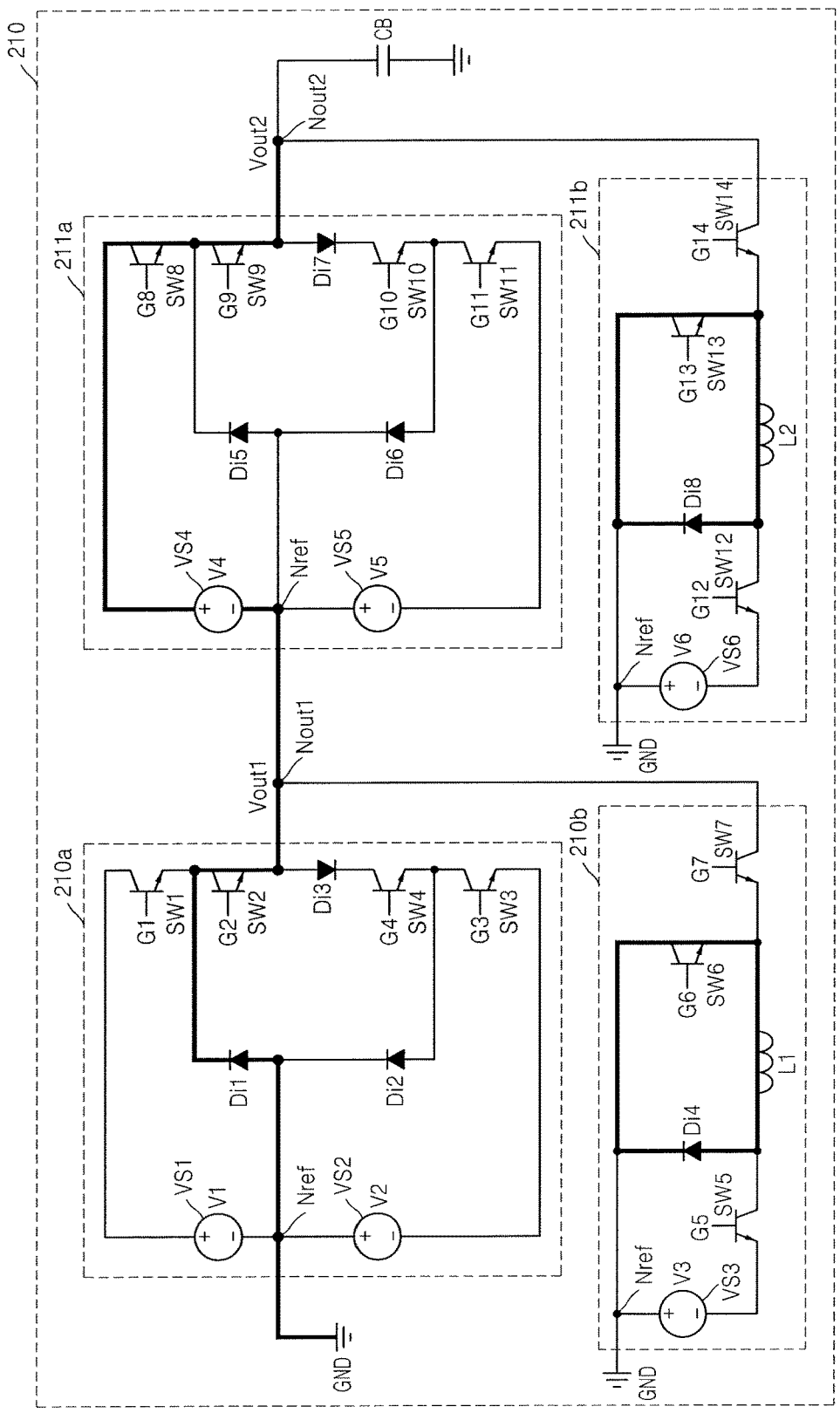

Referring to FIGS. 7, 9, 10, and 17, in P250, the controller 220 may apply 1 to the second, third, sixth, eighth, ninth, and thirteenth gate driving signals G2, G3, G6, G8, G9, and G13, and may apply 0 to the first, fourth, fifth, seventh, tenth, eleventh, twelfth, and fourteenth gate driving signals G1, G4, G5, G7, G10, G11, G12, and G14, during the fifth interval D5. Accordingly, the second, third, sixth, eighth, ninth, and thirteenth switches SW2, SW3, SW6, SW8, SW9, and SW13 are turned on, and the first, fourth, fifth, seventh, tenth, eleventh, twelfth, and fourteenth switches SW1, SW4, SW5, SW7, SW10, SW11, SW12, and SW14 are turned off. Thus, electrical paths as indicated by bold lines in FIG. 17 are formed, and the sixth voltage source VS6 is disconnected from the second inductor and a loop through which current of the second inductor L2 flows is formed. Again, the first output terminal Nout1 is connected to the ground terminal GND via the first diode Di1 and the second switch SW2, potential of the first output terminal Nout1 may be substantially the same as the potential of the ground terminal GND. At this time, operations of the second pulse circuit 211a and the second slope circuit 211b may be substantially the same as those of the pulse circuit 110a and the slope circuit 110b of FIG. 4B, respectively. A current flowing in the first inductor L1 may be constant, similar to FIG. 11.

Figure 18:
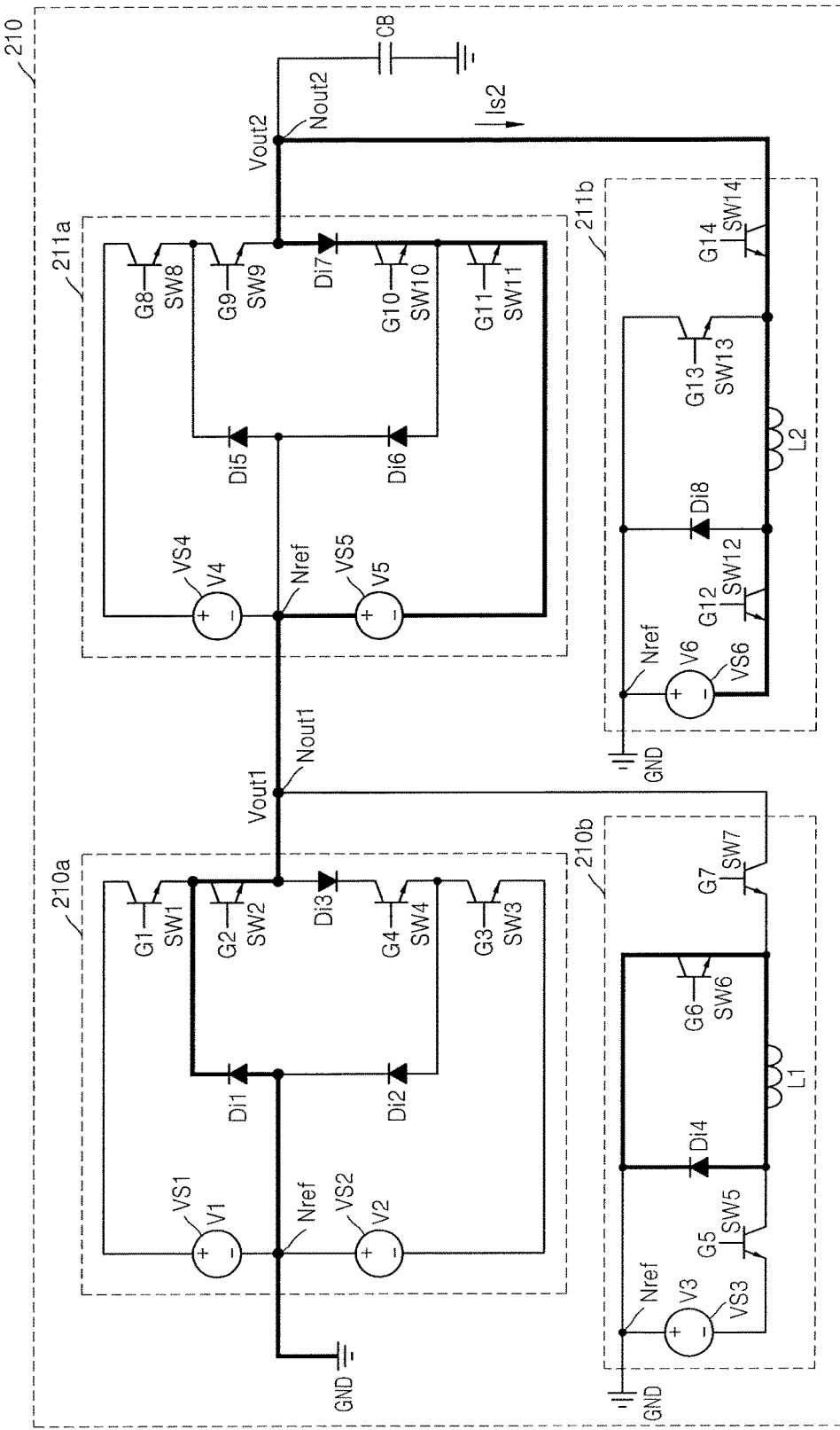

Referring to FIGS. 7, 9, 10, and 18, in P260, the controller 220 may apply 1 to the second, third, sixth, tenth, eleventh, twelfth, and fourteenth gate driving signals G2, G3, G6, G10, G11, G12, and G14 and apply 0 to the first, fourth, fifth, seventh, eighth, ninth, and thirteenth gate driving signals G1, G4, G5, G7, G8, G9, and G13, during the sixth interval D6. Accordingly, the second, third, sixth, tenth, eleventh, twelfth, and fourteenth switches SW2, SW3, SW6, SW10, SW11, SW12, and SW14 are turned on and the first, fourth, fifth, seventh, eighth, ninth, and thirteenth switches SW1, SW4, SW5, SW7, SW8, SW9, and SW13 are turned off. Thus, electrical paths as indicated by bold lines in FIG. 18 are formed, and the fourth voltage source VS4 is floated, the fifth voltage source VS5 is connected to the capacitive load via the seventh diode Di7, and the capacitive load is coupled with the second inductor L2. Accordingly, a current Is2 may flow from the chamber CB to the second inductor L2, e.g., the second inductor L2 takes current out of the chamber CB. Again, the first output terminal Nout1 is connected to the ground terminal GND via the first diode Di1 and the second switch SW2, potential of the first output terminal Nout1 may be substantially the same as the potential of the ground terminal GND. At this time, operations of the second pulse circuit 211a and the second slope circuit 211b may be substantially the same as those of the pulse circuit 110a and the slope circuit 110b of FIG. 4C, respectively. A current flowing in the first inductor L1 may be constant, similar to FIG. 11.

Figure 19:
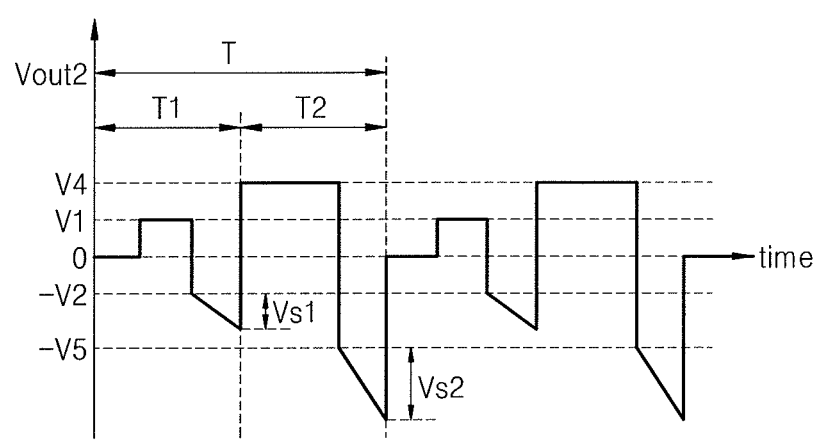
FIG. 19 illustrates a graph for explaining a voltage output by a voltage generator, according to some embodiments.

FIG. 19 is a graph for explaining a voltage output by the voltage generator 210 according to some embodiments. Referring to FIGS. 10 through 19, during the first time period T1, the potential of the ground terminal GND is applied as the second output voltage Vout2 during the first inactive interval Df1, a voltage of the first voltage source VS1 is applied as the second output voltage Vout2 during the first and second intervals D1 and D2, a slope voltage falling from a negative voltage of the second voltage source VS2 by Vs1 is applied as the second output voltage Vout2 during the third interval D3, During the second period T2, the potential of the ground terminal GND is applied as the second output voltage Vout2 during the second inactive interval Df2, the fourth voltage V4 of the fourth voltage source VS4 is applied as the second output voltage Vout2 during the fourth and fifth intervals D4 and D5, and a slope voltage falling from a negative fifth voltage V5 of the fifth voltage source VS5 by Vs2 is applied as the second output voltage Vout2 to the chamber CB during the fifth interval D5.

According to some embodiments, voltages having different pulse widths and inclinations of slope voltages may be applied to a chamber. In detail, an absolute value of a sum (V1+V2) of the first voltage V1 and the second voltage V2 during the first period T1 is related with the magnitude of energy of plasma ions (for example, an average of the energy), and an open form and inclination of a slope during the third interval D3 are related with an energy distribution of the plasma ions. Similarly, an absolute value of a sum (V4+V5) of the fourth voltage V4 and the fifth voltage V5 during the second period T2 is related with the magnitude of the energy of the plasma ions (for example, an average of the energy), and an open form and inclination of a slope during the sixth interval D6 are related with the energy distribution of the plasma ions. According to some embodiments, by alternately applying voltage of different waveforms, a plasma ion energy may be controlled to have different energy magnitudes and a desirable distribution.

Figure 20:
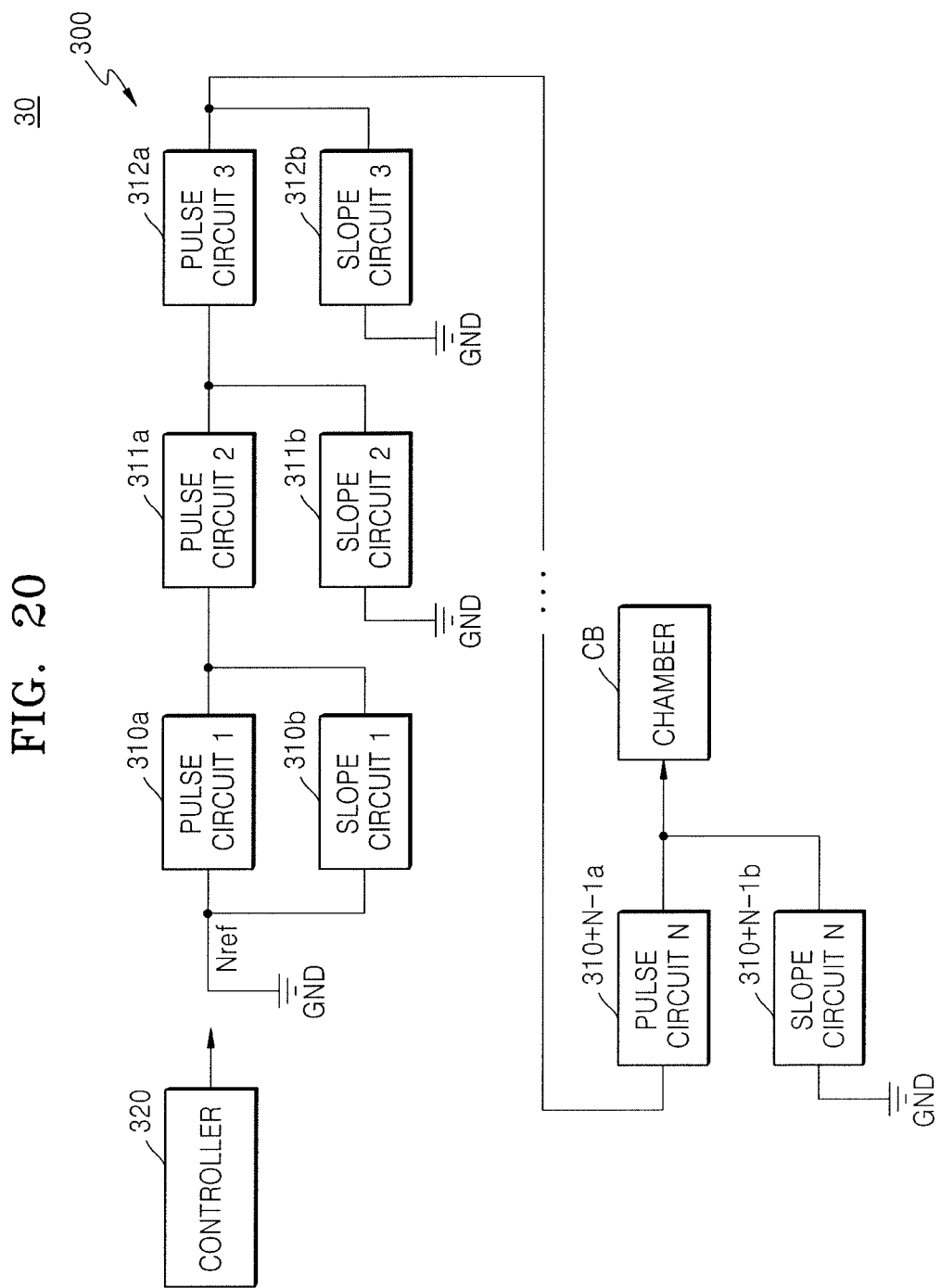
FIGS. 20 through 22 illustrate schematic block diagrams of semiconductor device manufacturing apparatuses according to some embodiments.
Figure 21:
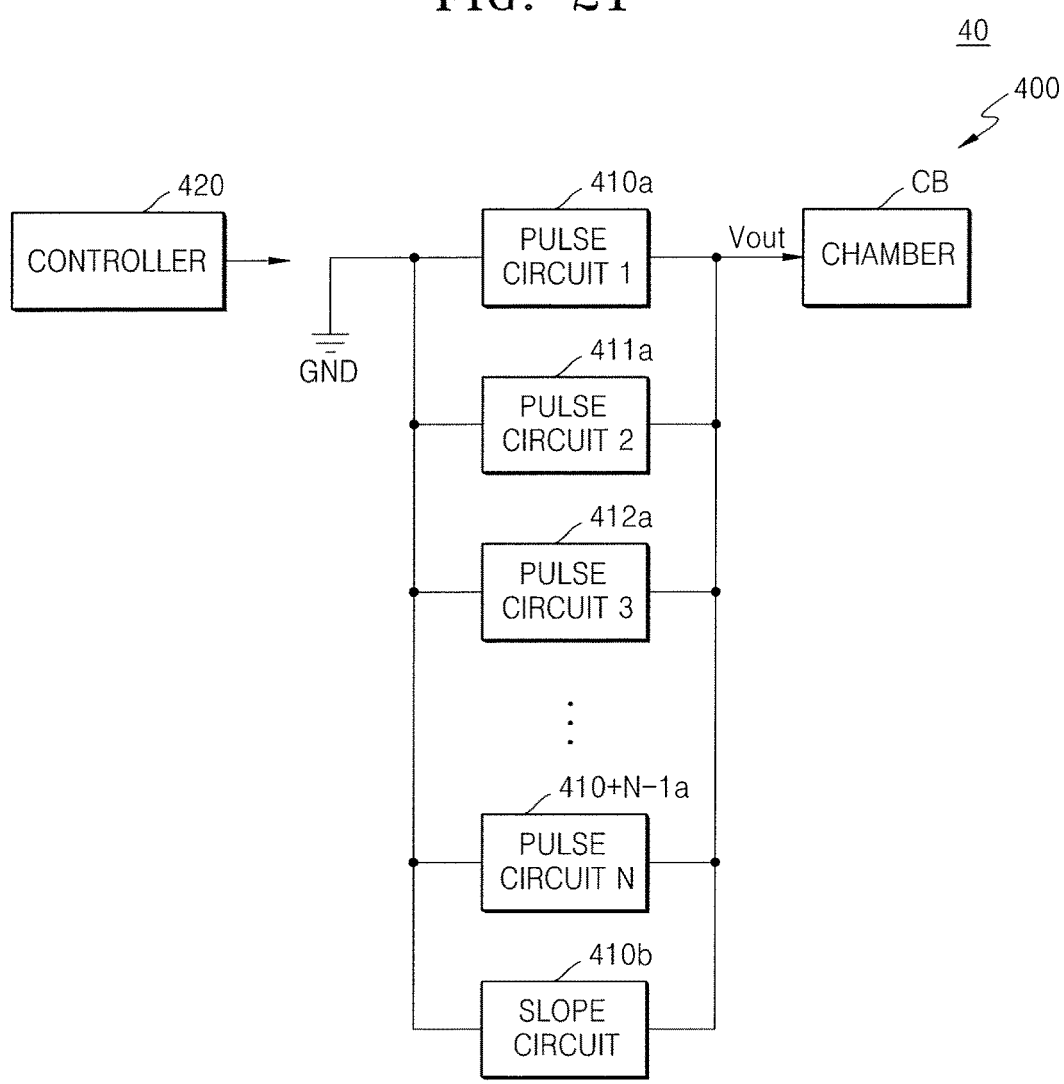
Figure 22:
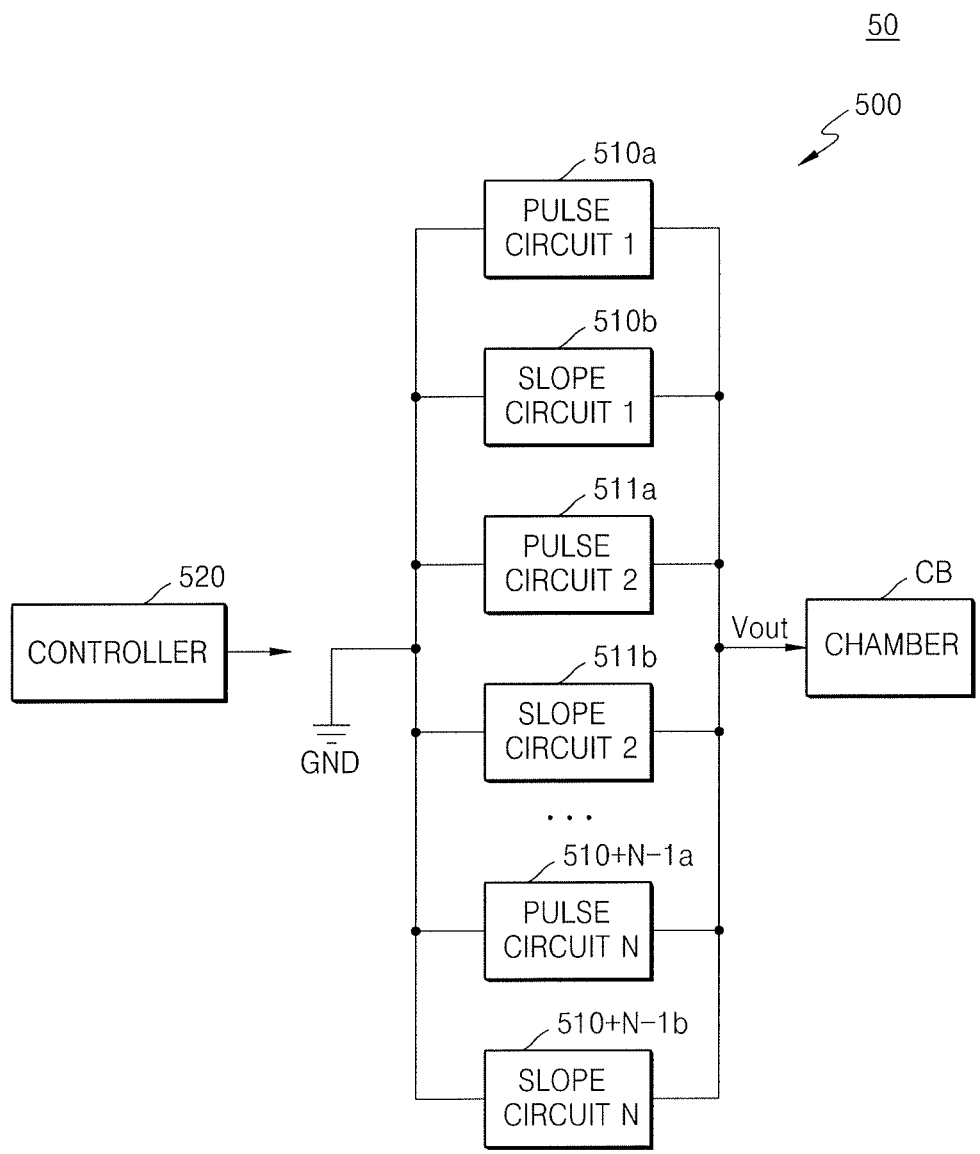

FIGS. 20 through 22 are schematic block diagrams of semiconductor device manufacturing apparatuses 30, 40, and 50 according to some embodiments.

Referring to FIG. 20, the semiconductor device manufacturing apparatus 30 may include a voltage waveform generator 300 and a chamber CB. The chamber CB may be substantially the same as the chamber CB described above with reference to FIG. 1. The voltage waveform generator 300 may include a controller 320, a plurality of pulse circuits 310a, 311a, 312a, . . . , and 310+N−1a, and a plurality of slope circuits 310b, 311b, 312b, . . . , and 310+N−1b. The plurality of pulse circuits 310a, 311a, 312a, . . . , and 310+N−1a may be substantially the same as the pulse circuit 110a described above with reference to FIGS. 1 and 2. The plurality of slope circuits 310b, 311b, 312b, . . . , and 310+N−1b may be substantially the same as the slope circuit 110b described above with reference to FIGS. 1 and 2.

According to some embodiments, each of the plurality of pulse circuits 310a, 311a, 312a, . . . , and 310+N−1a may include a reference terminal and an output terminal. According to some embodiments, the plurality of pulse circuits 310a, 311a, 312a, . . . , and 310+N−1a may be connected to each other in a cascade manner. According to some embodiments, the plurality of pulse circuits 310a, 311a, 312a, . . . , and 310+N−1a may be serially connected to each other between the chamber CB and the ground terminal GND. According to some embodiments, a reference terminal of one of the plurality of pulse circuits 310a, 311a, 312a, and 310+N−1a may be connected to the ground terminal GND. According to some embodiments, an output terminal of one of the plurality of pulse circuits 310a, 311a, 312a, . . . , and 310+N−1a may be connected to the chamber CB. According to some embodiments, an output terminal of one of the plurality of pulse circuits 310a, 311a, 312a, . . . , and 310+N−1a may be connected to a reference terminal of a subsequent circuit from among the plurality of pulse circuits 310a, 311a, 312a, . . . , and 310+N−1a.

According to some embodiments, the number of the plurality of slope circuits 310b, 311b, 312b, . . . , and 310+N−1b provided may be as many as the number of pulse circuits 310a, 311a, 312a, . . . , and 310+N−1a. According to some embodiments, the plurality of slope circuits 310b, 311b, 312b, . . . , and 310+N−1b may be connected to each other between the ground terminal GND and the chamber CB. According to some embodiments, each of the plurality of slope circuits 310b, 311b, 312b, . . . , and 310+N−1b may be connected to the output terminal of each of the plurality of pulse circuits 310a, 311a, 312a, . . . , and 310+N−1a such that the plurality of slope circuits 310b, 311b, 312b, . . . , and 310+N−1b have one-to-one correspondence with the plurality of pulse circuits 310a, 311a, 312a, . . . , and 310+N−1a. Alternatively, embodiments are not limited thereto, and the number of pulse circuits 310a, 311a, 312a, . . . , and 310+N−1a may be greater than that of slope circuits 310b, 311b, 312b, . . . , and 310+N−1b.

According to some embodiments, each of the plurality of pulse circuits 310a, 311a, 312a, . . . , and 310+N−1a may include first and second voltage sources, and each of the plurality of slope circuits 310b, 311b, 312b, . . . , and 310+N−1b may include a third voltage source and an inductor. According to some embodiments, a pulse circuit from among the plurality of pulse circuits 310a, 311a, 312a, . . . , and 310+N−1a that is arranged adjacent to the chamber CB may have greater absolute values of the voltages of the first and second voltage sources than a pulse circuit from among the plurality of pulse circuits 310a, 311a, 312a, . . . , and 310+N−1a that is arranged far from the chamber CB. According to some embodiments, a slope circuit from among the plurality of slope circuits 310b, 311b, 312b, . . . , and 310+N−1b that closer to the chamber CB may have a greater absolute value of the voltage of the third voltage source than a slope circuit from among the plurality of slope circuits 310b, 311b, 312b, . . . , and 310+N−1b that is further from the chamber CB. According to some embodiments, a slope circuit from among the plurality of slope circuits 310b, 311b, 312b, . . . , and 310+N−1b that is closer to the chamber CB may have an inductor with a greater inductance than a slope circuit from among the plurality of slope circuits 310b, 311b, 312b, . . . , and 310+N−1b that is further from the chamber CB.

According to some embodiments, when the plurality of pulse circuits 310a, 311a, 312a, . . . , and 310+N−1a and the plurality of slope circuits 310b, 311b, 312b, . . . , and 310+N−1b are provided, voltages of different waveforms may be sequentially and repeatedly applied to the chamber CB.

Referring to FIG. 21, the semiconductor device manufacturing apparatus 40 may include a voltage waveform generator 400 and a chamber CB. The chamber CB may be substantially the same as the chamber CB described above with reference to FIG. 1. The voltage waveform generator 400 may include a controller 420, a plurality of pulse circuits 410a, 411a, 412a, . . . , and 410+N−1a, and a slope circuit 410b.

The plurality of pulse circuits 410a, 411a, 412a, . . . , and 410+N−1a may be substantially the same as the pulse circuit 110a described above with reference to FIGS. 1 and 2. The slope circuit 410b may be substantially the same as the slope circuit 110b described above with reference to FIGS. 1 and 2. According to some embodiments, the plurality of pulse circuits 410a, 411a, 412a, . . . , and 410+N−1a and the slope circuit 410h may be connected to each other in parallel between the ground terminal GND and the chamber CB.

According to some embodiments, the slope circuit 410b may generate slopes corresponding to the plurality of pulse circuits 410a, 411a, 412a, . . . , and 410+N−1a by using the method described above with reference to FIGS. 4A through 4C. Accordingly, the plurality of pulse circuits shares the single slope circuit 410b, thereby providing a simplified circuit.

Alternatively, as shown in FIG. 22, as many of a plurality of slope circuits 510b, 511b, . . . , and 510+N−1b may be provided as the number of pulse circuits 510a, 511a, . . . , and 510+N−1a provided. According to some embodiments, each of the slope circuits 510b, 511b, . . . , and 510+N−1b may be connected to an output terminal of each of the plurality of pulse circuits 510a, 511a, . . . , and 510+N−1a such that the plurality of slope circuits 510b, 511b, . . . , and 510+N−1b have one-to-one correspondence with the plurality of 510a, 511a, . . . , and 510+N−1a. Further alternatively, the number of pulse circuits 510a, 511a, . . . , and 510+N−1a may be greater than that of slope circuits 510b, 511b, . . . , and 510+N−1b.

Figure 23:
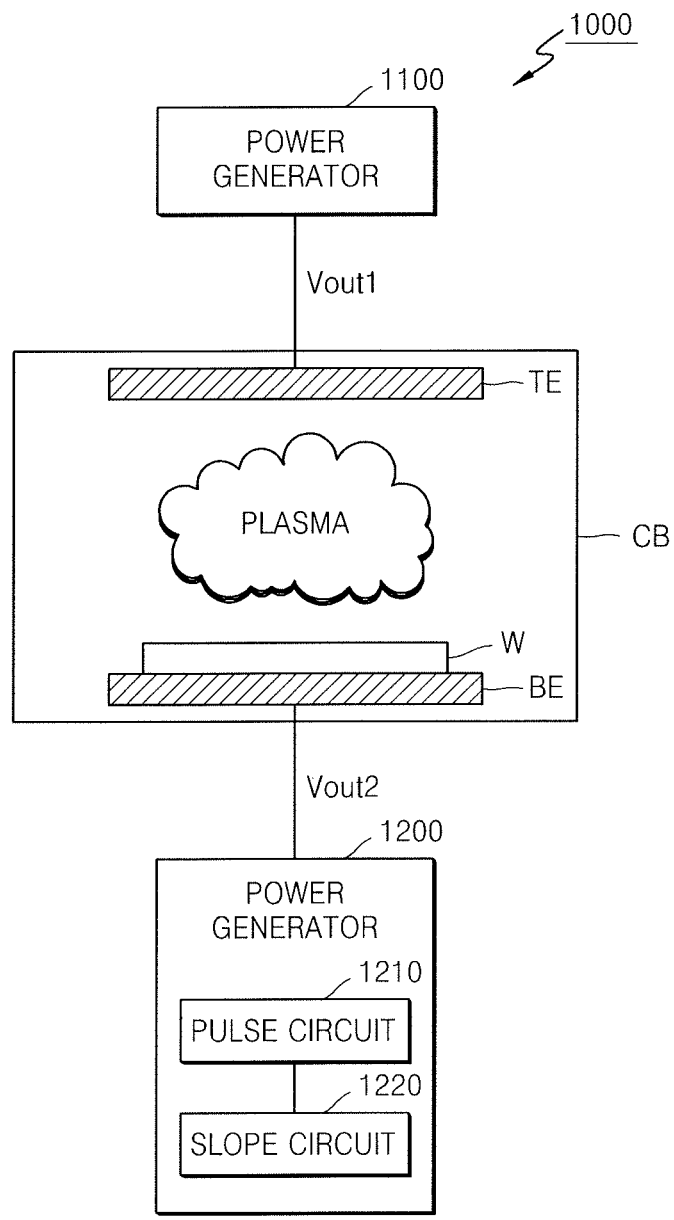
FIG. 23 illustrates a schematic block diagram of a semiconductor device manufacturing apparatus according to some embodiments.

FIG. 23 is a block diagram of a semiconductor device manufacturing apparatus 1000 according to some embodiments. Referring to FIG. 23, the semiconductor device manufacturing apparatus 1000 may include a chamber CB, a first power generator 1100, and a second power generator 1200. A top electrode TE may be at an upper portion of the chamber CB, a bottom electrode BE may be at a lower portion of the chamber CB, and a wafer W may be between the top electrode TE and the bottom electrode BE. According to some embodiments, the bottom electrode, BE is an electrostatic chuck (ESC) absorbing and supporting the wafer W using an electrostatic force. The chamber CB may include a gas supply unit and a gas discharge unit. The gas supply unit may supply a reaction gas into the chamber CB. The chamber CB may be maintained in a vacuum state by discharging the gas through the gate discharge unit.

The first power generator 1100 may generate a first power and apply the generated first power to the top electrode TE.

The first power may be used to generate plasma, and may be referred to as a "source power". According to some embodiments, the first power may be a radio frequency (RF) power, and the first power generator 250 may be referred to as an RF power generator. However, the first power generator 1100 may be implemented as one of the voltage waveform generators 100, 200, 300, 400, and 500 of FIGS. 1, 7, and 19-21.

The second power generator 1200 may generate a second power and apply the generated second power to the bottom electrode BE. The second power generator may include a pulse circuit 1210 and a slope circuit 1220, and may be implemented as one of the voltage waveform generators 100, 200, 300, 400, and 500 of FIGS. 1, 7, and 19-21. The second power may be used to control ion energy of the plasma, and may be referred to as a "bias power". When the second power is applied to the bottom electrode BE, a voltage may be induced to the wafer W on the bottom electrode BE. Accordingly, the voltage of the wafer W may be controlled by the second power. Thus, the ion energy of the plasma generated in the chamber CB may be controlled.

According to the present embodiment, the second power generator 1200 may generate an arbitrary waveform having a high voltage and a high frequency set by a user. For instance, the second power generator 1200 may generate a voltage having a certain waveform that is output at a frequency of several kHz to several MHz and has a voltage level of several tens of volts (V) to several tens of kilovolts (kV). The second power generator 1200 may be implemented by using the voltage waveform generators 100, 200, 300, 400, and 500 of FIGS. 1, 7, and 20-22. The above-described explanations with reference to FIGS. 1 to 22 may be applied to the second power generator 1200.

In detail, the second power generator 1200 may include at least one pulse circuit and at least one slope circuit, and the at least one pulse circuit and the at least one slope circuit may be connected to each other in one of the manners shown in FIGS. 1, 7, and 20-22. The at least one pulse circuit may generate a square wave, and the at least one slope circuit may generate a variable waveform.

As shown in FIGS. 7 and 20-22, the second power generator 1200 may include a plurality of pulse circuits and a plurality of slope circuits. A magnitude distribution of ion energy generated by the second power generator 1200 may be determined based on the number of pulse circuits and the number of slope circuits. Accordingly, according to target magnitude distributions of ion energy, the number of pulse circuits that are activated from among the pulse circuits and the number of slope circuits that are activated from among the slope circuits may be determined.

The distribution of the ion energy may be determined in accordance with a slope voltage waveform output by the at least one slope circuit. Accordingly, the controller (e.g., the controller 120 of FIG. 1) of the second power generator 1200 may control the gate drive signals according to the target distribution of ion energy. For example, the second power generator 1200 may output a waveform of a slope voltage that enables plasma ions of the second output voltage Vout2 to be distributed over a narrow energy area.

According to some embodiments, the semiconductor device manufacturing apparatus 1000 may further include a filter between the second power generator 1200 and the bottom electrode BE. The filter may block the first power generated by the first power generator 1100 to prevent the first power from being applied to the second power generator 1200, and may transmit the second power generated by the second power generator 1200 to allow the second power to be applied to the bottom electrode BE. In detail, the filter may remove a frequency component of the RF power generated by the first power generator 1100. For instance, the filter may include a low pass filter, a band stop filter, or a combination of the low pass filter and the band stop filter.

According to some embodiments, the semiconductor device manufacturing apparatus 1000 may further include a filter between the first power generator 1100 and the top electrode TE. The filter may block the second power generated by the second power generator 1200 to prevent the first power from being applied to the first power generator 1100, and may transmit the first power generated by the first power generator 1100 to allow the first power to be applied to the top electrode TE. For instance, the filter may be configured to include a low pass filter, a band stop filter, or a combination of the low pass filter and the band stop filter.

The reaction gas may be dispersed in the chamber CB and converted to the plasma by the first power provided through the top electrode TE and the second power provided through the bottom electrode BE. The plasma may make contact with a surface of the wafer W to physically and chemically react with the wafer W, and a wafer processing process, such as a plasma annealing process, an etching process, a plasma enhanced chemical vapor deposition process, a physical vapor deposition process, or a plasma cleaning process, may be performed through the above-mentioned reaction.

For example, when the semiconductor device manufacturing apparatus 1000 is used in the etching process, the reaction gas may become plasma due to a high frequency discharge occurring between the bottom electrode BE and the top electrode TE, and a processed layer on the wafer W may be etched into a desired pattern by radicals, electrons, and ions, which are activated by the plasma. According to the present embodiment, when the radicals, electrons, and ions of the plasma are precisely controlled, an etching performance, such as an etching rate, an aspect ratio, a critical dimension of the etching pattern, a profile of the etching pattern, an etching selectivity, etc., may be improved. Hereinafter, a case where the semiconductor device manufacturing apparatus 1000 is used in the etching process will be described in detail, but voltage waveform generators or second power generators according to embodiments may be used in any semiconductor equipment.

Figure 24:
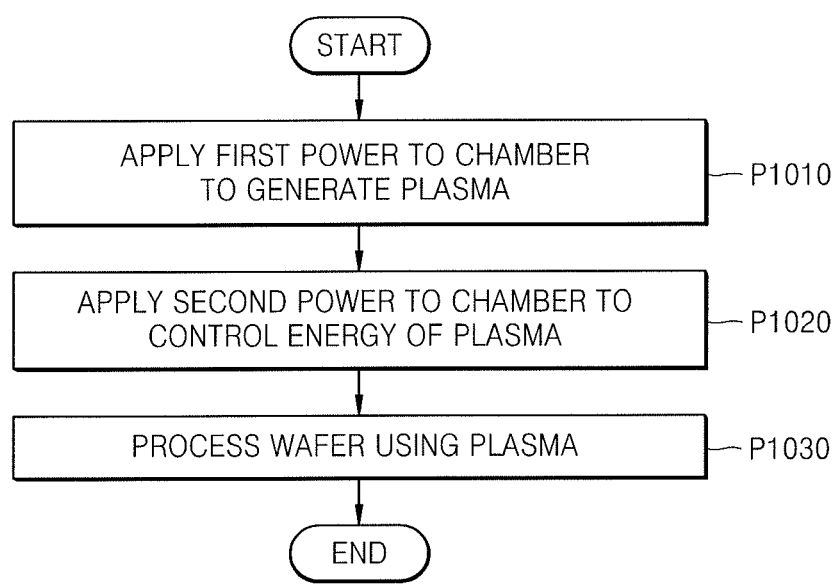
FIG. 24 illustrates a flowchart of a semiconductor device manufacturing method according to some embodiments.

FIG. 24 is a flowchart of a semiconductor device manufacturing method according to some embodiments.

Referring to FIGS. 23 and 24, in P1010, the first power generator 1100 may generate the first power to generate plasma ions, and apply the generated first power to the top electrode TE.

Then, in P1020, the second power generator 1200 may generate the second power to control ion energy of plasma, and apply the generated second power to the bottom electrode BE.

In P1030, the wafer W may be processed using plasma. Examples of the wafer processing using plasma may include a plasma annealing process, an etching process, a plasma enhanced chemical vapor deposition process, a physical vapor deposition process, and a plasma cleaning process.

Figure 25A:
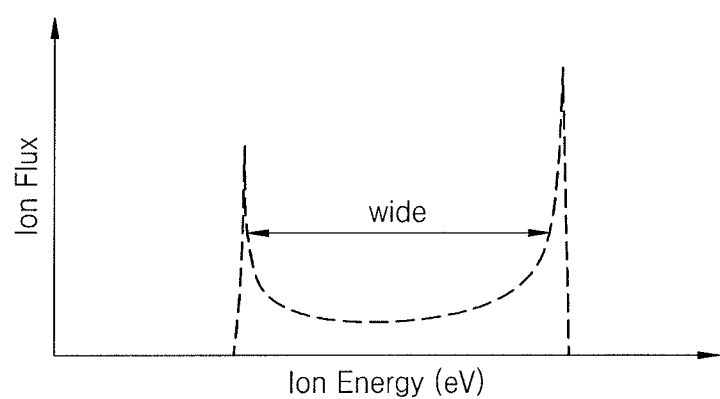
FIG. 25A illustrates a graph showing plasma ion energy distribution when energy is supplied to plasma ions by radio frequency (RF) power.
Figure 25B:
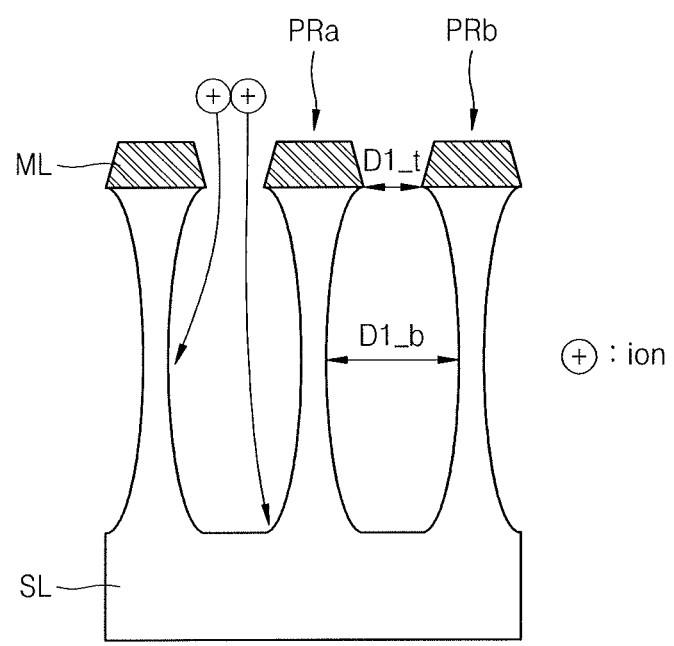
FIG. 25B illustrates a cross-sectional view of an etched structure resulting from plasma ions having an energy distribution of FIG. 25A.

FIG. 25A is a graph showing a plasma ion energy distribution when energy is supplied to plasma ions by RF power. FIG. 25B is a cross-sectional view of an etching resultant structure due to the plasma ions of FIG. 25A.

Referring to FIG. 25A, the horizontal axis indicates energy of the plasma ions, and the vertical axis indicates a density of the plasma ions according to the energy. Each of the horizontal axis and the vertical axis has an arbitrary unit. When the RF power is applied to the top electrode TE and the bottom electrode BE in the chamber CB, a distribution of ion flux according to the ion energy of the plasma may appear over a wide area. Accordingly, when the RF power is applied to the bottom electrode BE in the chamber CB, it may be difficult to control the ion energy of the plasma to be distributed in a narrow band.

Referring to FIG. 25B, an etching process is performed on a semiconductor layer SL and a mask layer ML to form a plurality of protrusions PRa and PRb. In the ion energy distribution shown in FIG. 25A, a linearity of low-energy ions having low energy is low, and a moving distance of the low-energy ions is short. As a result, a bowing phenomenon may occur in the etching process performed on a semiconductor structure. In this case, a difference between an upper distance $D1\_t$ between the protrusions PRa and PRb and a lower distance $D1\_b$ between the protrusions PRa and PRb is relatively great.

In the related art, to address this problem, a method for limiting the plasma ion energy distribution to a narrow energy area has been studied. For example, a periodic voltage (square waves or pulse waves) has been generated by controlling a switching mode power supply. In this case, a user may control ion energy having a narrow distribution by controlling the magnitude of the periodic voltage, but may generate only one ion energy. Because a slow response appears due to the control of the ion energy magnitude, it is impossible to alternately provide power having different energy distribution bands to the plasma ions with a high frequency (for example, several kHz or greater).

Because the distribution of ion energy appears in a narrow area, linearity of ions improves, leading to an improvement in an etching profile with respect to the semiconductor layer SL and the mask layer ML and a reduction of a bowing phenomenon. However, when high ion energy is used to obtain a big etching depth, the mask layer ML that protects the semiconductor layer SL is also etched, and thus the thickness of the mask layer ML may be greatly reduced. Accordingly, while the semiconductor layer SL, which is below the mask layer ML, is being etched, or in a subsequent process, the semiconductor layer SL may not be protected.

Figure 26A:
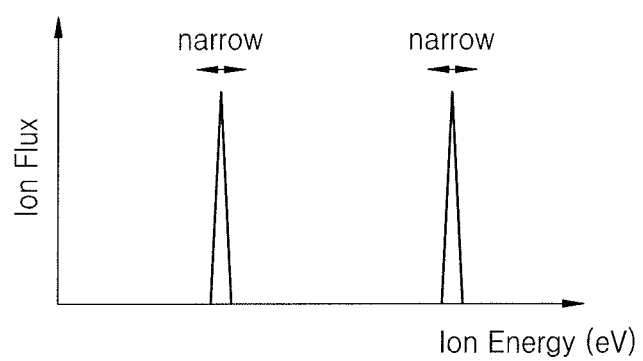
FIG. 26A illustrates a graph showing an energy distribution of plasma ions during a plasma process using a voltage waveform, according to some embodiments.
Figure 26B:
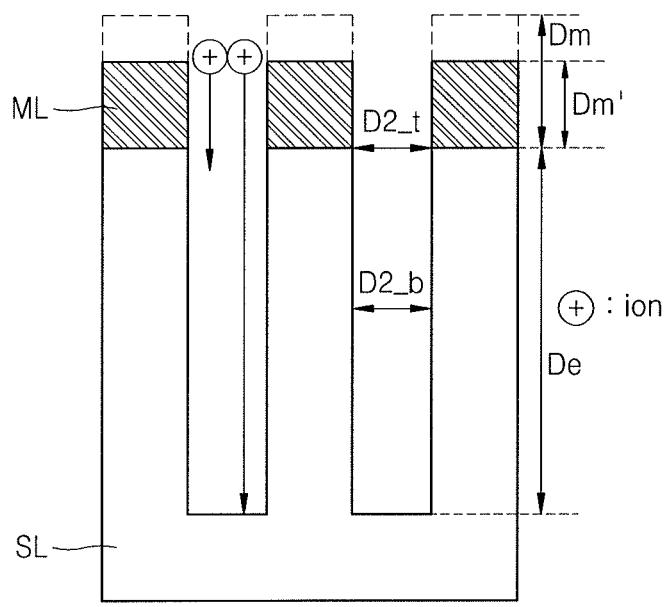
FIG. 26B illustrates a cross-sectional view of an etched structure resulting from plasma ions having an energy distribution of FIG. 26A.

FIG. 26A is a graph showing an energy distribution of plasma ions during a plasma process using a voltage waveform, according to some embodiments. FIG. 26B is a cross-sectional view of a structure in a plasma process corresponding to FIG. 26A. In more detail, FIGS. 26A and 26B illustrate an ion energy distribution and a cross-section of a structure in a plasma process, respectively, when the voltage waveform of FIG. 19 is used as the second power of FIG. 23.

Referring to FIG. 26A, the horizontal axis indicates energy of the plasma ions, and the vertical axis indicates a density of the plasma ions according to the energy. Each of the horizontal axis and the vertical axis has an arbitrary unit. Referring to FIGS. 19 and 26A, the voltage waveform during the first period T1 is distributed in a narrow energy band while having a relatively low average energy value, and the voltage waveform during the second period T2 is distributed in a narrow energy band while having a relatively high average energy value. In this case, when high energy is applied to plasma ions, etching occurs, and, when low energy is applied to plasma ions, deposition occurs. The deposition may be mainly conducted on the mask layer ML.

Referring to FIG. 26B, a difference between an upper distance $D2\_t$ and a lower distance $D2\_b$ may be maintained relatively small due to a reduction of a bowing phenomenon. Moreover, even when an etching depth De is increased, a thickness Dm' may be obtained after the mask layer ML is sufficiently etched. Accordingly, an etching profile may improve, and also etching capable of protecting the semiconductor layer SL, which is below the mask layer ML, may be performed. This etching method is applicable to a process for forming a shallow trench isolation (STI) on the semiconductor layer SL.

Embodiments provide a voltage waveform generator, a semiconductor device manufacturing apparatus, a voltage waveform generation method, and a semiconductor device manufacturing method, which are capable of controlling ion energy of plasma by providing power having an arbitrary waveform set by a user.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A voltage generator, comprising:
   a pulse circuit configured to apply voltages of three different levels to an output terminal; and
   a slope circuit configured to apply a slope voltage to the output terminal,
   wherein the slope circuit includes an inductor configured to take current out of a capacitive load connected to the output terminal.

2. The voltage generator as claimed in claim 1, wherein the pulse circuit includes a first voltage source having a negative terminal connected to a reference terminal, and a second voltage source having a positive terminal connected to the reference terminal.

3. The voltage generator as claimed in claim 2, wherein the pulse circuit further includes:
   a first switch and a second switch, which are serially connected to a positive terminal of the first voltage source; and
   a third switch and a fourth switch, which are serially connected to a negative terminal of the second voltage source.

4. The voltage generator as claimed in claim 3, wherein:
   the pulse circuit further includes a first diode having an anode and a cathode,
   the anode is connected to the reference terminal, and
   the cathode is connected between the first and second switches.

5. The voltage generator as claimed in claim 3, wherein the pulse circuit further includes a second diode having a cathode and an anode, wherein the cathode is connected to the reference terminal, and the anode is connected between the third and fourth switches.

6. The voltage generator as claimed in claim 3, wherein the pulse circuit further includes a third diode connected between the second and fourth switches.

7. The voltage generator as claimed in claim 6, wherein an anode of the third diode is connected to the second switch, and a cathode of the third diode is connected to the fourth switch.

8. The voltage generator as claimed in claim 6, wherein an anode of the third diode is connected to the output terminal.

9. The voltage generator as claimed in claim 3, wherein the slope circuit further includes:
   a third voltage source; and
   a fifth switch connected between the third voltage source and the inductor.

10. The voltage generator as claimed in claim 9, wherein the slope circuit further includes a fourth diode connected between the reference terminal and one terminal of the inductor.

11. The voltage generator as claimed in claim 10, wherein the slope circuit further includes a sixth diode connected between the reference terminal and another terminal of the inductor.

12. The voltage generator as claimed in claim 10, wherein the slope circuit further includes a seventh diode connected between the output terminal and a terminal of the inductor other than those to which the fourth diode and the sixth diode are connected to another terminal of the inductor.

13. A voltage waveform generator, comprising:
   a voltage generator including a pulse circuit configured to apply a voltage of a first level and a voltage of a second level to an output terminal, and a slope circuit configured to apply a slope voltage to the output terminal; and
   a controller configured to control the voltage generator such that a voltage of the output terminal is maintained at the first level during a first interval, the voltage of the output terminal is maintained at the first level during a second interval following the first interval, and a slope voltage changing from the second level to a third level having a greater magnitude than the second level is applied during a third interval following the second interval,
   wherein the slope circuit includes an inductor, and applies the slope voltage by discharging a capacitive load connected to the output terminal by using a current of the inductor.

14. The voltage waveform generator as claimed in claim 13, wherein
   the slope circuit further includes a direct current (DC) voltage source, and
   the controller is further to control the slope circuit to increase the current of the inductor by using the DC voltage source, during the first interval.

15. The voltage waveform generator as claimed in claim 13, wherein, during the second interval, the controller is further to control the slope circuit such that the current of the inductor is maintained substantially constant.

16. The voltage waveform generator as claimed in claim 13, wherein, during the third interval, the controller is further to control the slope circuit to increase the current of the inductor to charge or discharge the capacitive load by using the current of the inductor.

17. The voltage waveform generator as claimed in claim 16, wherein
   the pulse circuit includes a diode, and
      the diode is connected to the output terminal such that current does not flow from the capacitive load to the pulse circuit, during the third interval.

18. A semiconductor device manufacturing apparatus, comprising:
   a voltage waveform generator; and
   a chamber to receive a voltage output by the voltage waveform generator,
   wherein the voltage waveform generator includes:
      at least one pulse circuit configured to output voltages of at least three different levels; and
      at least one slope circuit configured to output a slope voltage, wherein the at least one slope circuit includes an inductor configured to generate current used to generate the slope voltage.

19. The semiconductor device manufacturing apparatus as claimed in claim 18, wherein the at least one pulse circuit further includes an output terminal and diodes, the diodes each including an anode connected to the output terminal.

20. The semiconductor device manufacturing apparatus as claimed in claim 18, wherein the at least one slope circuit further includes:
   a direct current (DC) voltage source; and
   a switch arranged between the DC voltage source and the inductor.

* * * * *